United States Patent [19]

Kumakura et al.

[11] Patent Number: 5,519,652
[45] Date of Patent: May 21, 1996

[54] NONVOLATILE SEMICONDUCTOR MEMORY FOR POSITIVELY HOLDING STORED DATA

[75] Inventors: Sinsuke Kumakura, Kawasaki; Yasushige Ogawa, Kasugai; Takao Akaogi; Tetsuya Chida, both of Kawasaki, all of Japan

[73] Assignees: Fujitsu Limited, Kawasaki; Fujitsu VLSI Limited, Kasugai, both of Japan

[21] Appl. No.: 158,796

[22] Filed: Dec. 1, 1993

[30] Foreign Application Priority Data

Dec. 7, 1992 [JP] Japan ................................. 4-326848

[51] Int. Cl.$^6$ ............................................. G11C 11/34
[52] U.S. Cl. .......................... 365/185.21; 365/185.12
[58] Field of Search ........................ 365/185, 189.01, 365/210, 201

*Primary Examiner*—David C. Nelms
*Assistant Examiner*—F. Niranjan
*Attorney, Agent, or Firm*—Staas & Halsey

[57] ABSTRACT

A semiconductor memory has a plurality of word lines, a plurality of bit lines, a plurality of memory cells, a differential sense amplifier, and load transistors. Each of the memory cells is a MIS transistor formed at each intersection of the word and bit lines. The threshold voltage of the MIS transistor is externally electrically controllable. The differential sense amplifier senses data stored in a selected memory cell located at an intersection of selected word and bit lines. A control pulse signal is applied to the gates of the load transistors, to bias the bit lines. The pulse width of the control pulse signal is a minimum essential to read data out of the selected memory cell. The control pulse signal controls the switching of the load transistors, to shorten a period during which a stress voltage is continuously applied to the drains of unselected memory cells that are connected to the bit line to which the selected memory cell is connected.

18 Claims, 24 Drawing Sheets

NONVOLATILE SEMICONDUCTOR MEMORY FOR POSITIVELY HOLDING STORED DATA

BACKGROUND OF THE INVENTION

1. Field of the Invention

The present invention relates to a semiconductor memory and, more particularly, to a nonvolatile semiconductor memory such as a flash memory.

2. Description of the Related Art

EPROMs (Erasable Programmable Read Only Memories) are nonvolatile semiconductor memories that are erasable with ultraviolet rays and are electrically programmable. Flash memories recently attracting attention are nonvolatile semiconductor memories that are electrically erasable and programmable.

A nonvolatile semiconductor memory has a sense amplifier to read data out of a selected one of the memory cells contained in the memory. While a memory cell is being read, the other memory cells receive a stress voltage to age data stored in these memory cells. For example, when data is read out of a given memory cell (MIS transistor) in a flash memory, the other memory cells connected to a bit line to which the given memory cell is connected, thereby to continuously receive a stress voltage through their respective drains.

Data is stored in a selected memory cell in an EPROM by injecting electrons into the floating gate of the selected memory cell. The EPROM must hold the stored data even after a power source is cut (i.e., discontinued, or removed). The data stored in the memory cell is read by testing whether the memory cell passes a current (data "1") or not (data "0"). If the floating gate of a memory cell has a defect of leaking electrons, the cell is unable to hold data. Even if a memory cell is provided with a sound oxide film, electrons caught in the floating gate of the memory cell sometimes escape because of production unevenness in the oxide film.

The escaping of electrons in a semiconductor memory depends on the kind and degree of defects in the memory. To screen defective semiconductor memories before shipment, a temperature acceleration test and an operation test are carried out. The temperature acceleration test leaves an objective semiconductor memory at a high temperature to accelerate the aging of data stored in memory cells of the memory. These tests, however, involve many steps and take a long time because recent semiconductor memories are of large capacity. The tests, therefore, increase the cost of the semiconductor memories.

A conventional method of screening semiconductor memories accesses every memory cell (bit) of an objective semiconductor memory, reads data stored in the memory cells, and compares the data with original data. Namely, the conventional method measures the high margin of the objective semiconductor memory before and after the temperature acceleration test and compares the measurements with each other. As the capacity of EPROMs expands year after year, this method increasingly involves many processes and takes a longer time, thereby increasing the manufacturing cost of the EPROMs.

SUMMARY OF THE INVENTION

An object of a first aspect of the present invention is to provide a semiconductor memory that minimizes a stress voltage applied to unselected memory cells when reading data out of a selected memory cell.

An object of a second aspect of the present invention is to provide a semiconductor memory capable of reading data with a low drain voltage, without increasing production processes and cost.

An object of a third aspect of the present invention is to test a semiconductor memory through a small number of steps in a short time.

According to the present invention, there is provided a semiconductor memory comprising a plurality of word lines, a plurality of bit lines, a plurality of memory cells each being a MIS transistor formed at each intersection of the word and the bit lines, the threshold voltage of the MIS transistor being externally electrically controllable, a differential sense amplifier for detecting data stored in a selected memory cell located at an intersection of a selected word line and a selected bit line, and a plurality of load transistors, the gates of the load transistors receiving a control pulse signal for biasing the bit lines, the control pulse signal having a minimum pulse width to read data out of the selected memory cell and controlling the switching of the load transistors, to shorten a period during which a stress voltage is continuously applied to the drains of unselected memory cells connected to the bit line to which the selected memory cell is connected.

Each of the word lines may be connected to the gates of corresponding ones of the memory cells arranged in an X direction, each of the bit lines may be connected to the drains of corresponding ones of the memory cells arranged in a Y direction, and the differential sense amplifier may provide a signal representing data "1" or "0" according to whether or not the selected memory cell is conductive. The control pulse signal supplied to the load transistors for biasing the bit lines may be an ATD pulse signal.

According to the present invention, there is also provided a semiconductor memory comprising a cell array containing a plurality of word lines, a plurality of bit lines, and a plurality of memory cells formed at intersections of the word line and the bit line, respectively; and a data decision circuit for determining data stored in a selected memory cell to be "1" or "0" according to whether or not the selected memory cell passes a current, wherein the data decision circuit includes a load unit connected between a first power source and a first node; a first transistor of a first conduction type having a drain connected to the first node, a source connected to a second power source, and a gate connected to a second node; and a second transistor of the first conduction type having a gate connected to the first node and a source connected to the second node, wherein the second node is electrically connected to the bit lines, and the first transistor being a natural transistor whose channel impurity concentration is equal to a substrate impurity concentration.

The drain of the second transistor may be connected to the first power source through a third transistor of a second conduction type opposite to the first conduction type, as well as to a data output through an inverter, and the third transistor having a gate connected to the second power source. The first and second transistors may be n-channel MIS transistors, and the third transistor may be a p-channel MIS transistor.

The load unit may be a fourth transistor of a second conduction type opposite to the first conduction type. The first and second transistors may be n-channel MIS transistors, and the fourth transistor may be a p-channel MIS transistor. The second node may be connected to a bus line.

Further, according to the present invention, there is provided a semiconductor memory comprising a cell array containing a plurality of word lines, a plurality of bit lines, and a plurality of memory cells formed at intersections of the word line and the bit line, respectively; and a data decision circuit for determining data stored in a selected memory cell to be "1" or "0" according to whether or not the selected memory cell passes current, wherein the data decision circuit includes a load unit connected between a first power source and a first node; a first transistor of a first conduction type having a drain connected to the first node, a source connected to a reference power source, and a gate connected to a second node; and a second transistor of the first conduction type having a gate connected to the first node and a source connected to the second node, wherein the source of the second transistor is connected to a third node through a voltage drop transistor of the first conduction type.

The drain of the second transistor may be connected to the first power source through a third transistor of a second conduction type opposite to the first conduction type, as well as to a data output through an inverter, and the gate of the third transistor may be connected to the reference power source. The first, second, and voltage drop transistors may be n-channel MIS transistors, and the third transistor may be a p-channel MIS transistor.

The load unit may be a fourth transistor of a second conduction type opposite to the first conduction type. The first, second, and voltage drop transistors may be n-channel MIS transistors, and the fourth transistor may be a p-channel MIS transistor. The third node may be connected to a bus line.

Further, according to the present invention, there is also provided a method of testing a semiconductor memory having an array of nonvolatile memory cells, by leaving the semiconductor memory at a high temperature to accelerate changes in data stored in the memory cells, wherein the method of testing the semiconductor memory comprises a step of writing predetermined test data into each of the memory cells, a first measuring step of measuring a current flowing through all of the memory cells, a step of leaving the semiconductor memory at a high temperature to accelerate defects in the memory cells, a second measuring step of again measuring a current flowing through all of the memory cells, and steps of comparing the currents measured in the first and second measuring steps with each other and determining the quality of the semiconductor memory.

The first and second measuring steps may measure each a current flowing through the memory cell array of the semiconductor memory. Each of the first and second measuring steps may measure a current flowing through the semiconductor memory as a whole.

In addition, according to the present invention, there is also provided a semiconductor memory having an array of nonvolatile memory cells and a function of testing changes in data held in the memory cells according to a temperature acceleration step of leaving the semiconductor memory at a high temperature, wherein the semiconductor memory comprises a test mode starting unit for starting a test mode of the semiconductor memory in response to a predetermined external signal, and a cell array current measuring unit for switching, when the test mode is started by the test mode starting unit, a connection between the memory cell array and a ground, to measure a current flowing through the memory cell array.

The cell array current measuring unit may write predetermined data into the memory cell array, measure a current flowing through the memory cell array, leave the semiconductor memory at a high temperature to accelerate defects in the memory cells, and again measure a current flowing through the memory cell array.

An output of the cell array current measuring unit may be converted by an analog/digital converter and be temporarily stored in a register.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Semiconductor memories according to the first to third aspects of the present invention will be explained below.

For a better understanding of the first aspect of the present invention, a prior art corresponding to the first aspect of the present invention and the problems thereof will be explained first.

Figure 1:
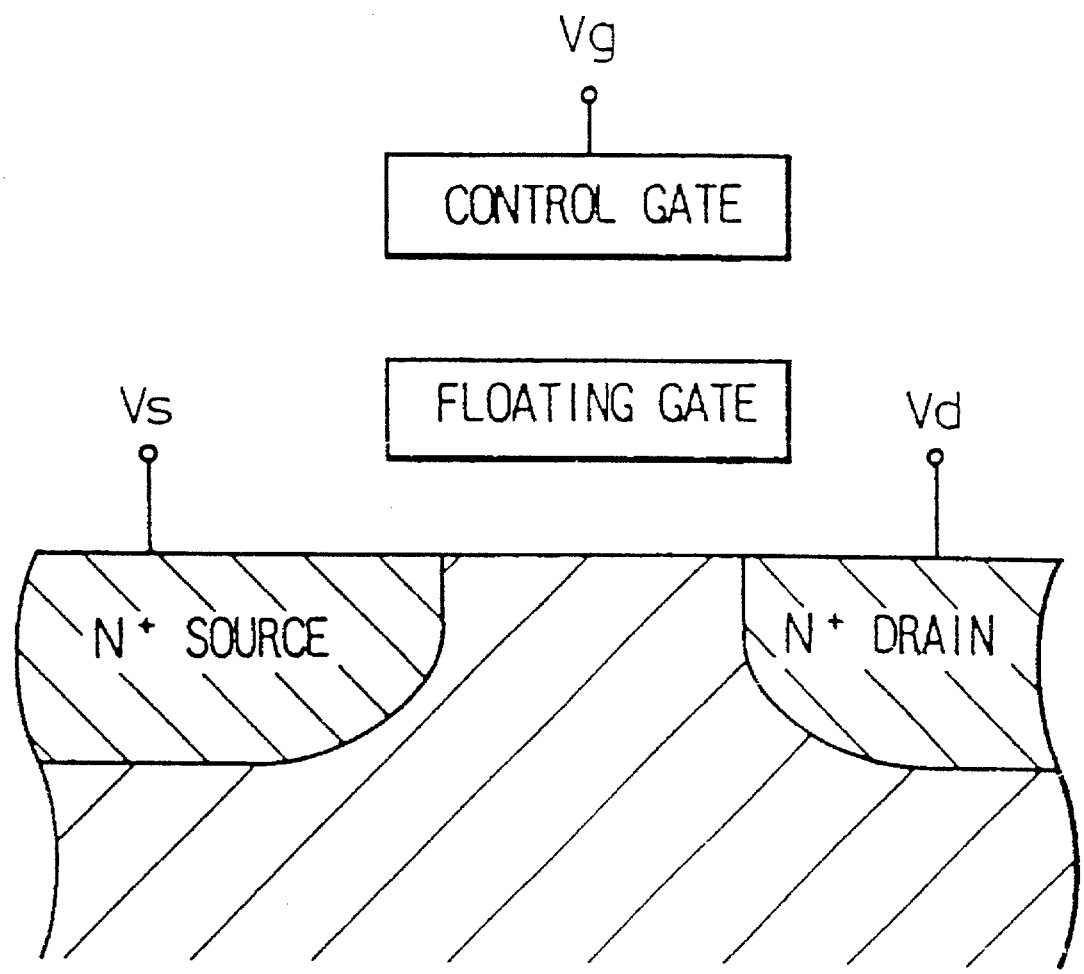
FIG. 1 is a sectional view showing a memory cell in a semiconductor memory according to a prior art.

FIG. 1 is a sectional view showing a memory cell in a semiconductor memory (an EPROM) according to the prior art. This memory cell is made of a MIS transistor having a floating gate.

To write data to the transistor, a voltage Vg=Vpp (a high voltage of, for example, 12 V) is applied to a control gate, and a voltage (Vd) of, for example, 6 V is applied to a drain, to inject electrons from the drain into the floating gate.

To read the data out of the transistor, a voltage Vg=Vcc (a source voltage of, for example, 5 V) is applied to the control gate and a voltage (Vd) of, for example, 1 V is applied to the drain, to see whether or not the transistor passes current and determine whether the data is 1 or 0.

The drain voltage Vd is set to be 1 V in order not to inject unnecessary electrons into the floating gate. As cell transistors of semiconductor memories become finer, a drain voltage applied to a cell transistor to read data therefrom must be lower.

Figure 2:
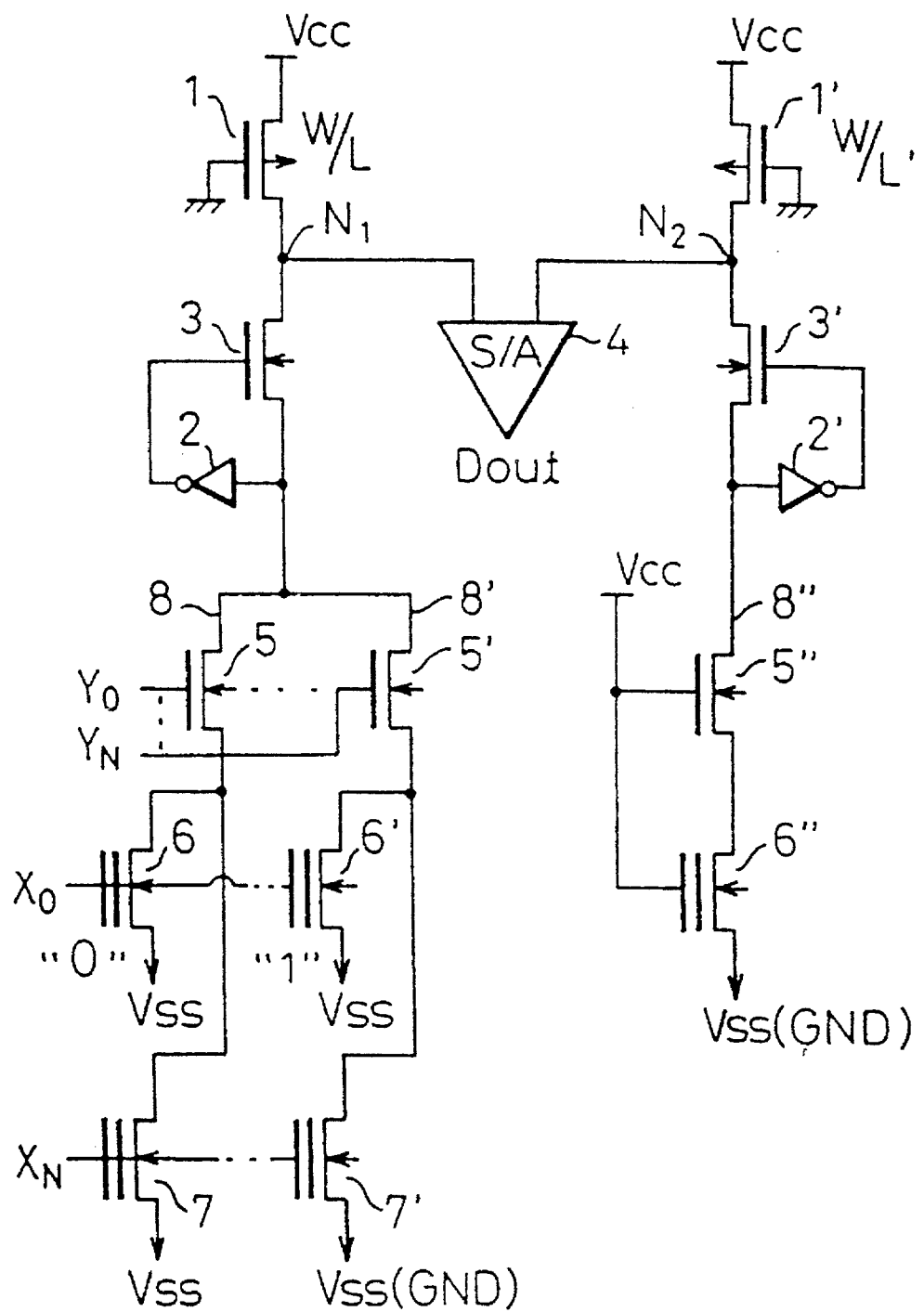
FIG. 2 is a circuit diagram showing a semiconductor memory according to a prior art corresponding to the first aspect of the present invention.

FIG. 2 shows a semiconductor flash memory, in particular its sense amplifier, according to a prior art corresponding to the first aspect of the present invention.

The flash memory includes sense amplifier load resistors 1 and 1', inverters 2 and 2' and n-channel transistors 3 and 3' for setting a voltage of about 1 V on bit lines 8 to 8' and 8", the sense amplifier (S/A) 4, n-channel transistors 5 to 5' and 5" for selecting the bit lines, memory cells 6 to 6' for storing data, and a reference cell 6" for comparing data read out of a selected memory cell with reference data. The flash memory also has memory cells 7 to 7', which are MIS transistors each having a floating gate, similar to the memory cells 6 to 6'. These memory cells form a memory cell array.

In the conventional semiconductor flash memory of FIG. 2, a source voltage Vcc is applied to the gates of the n-channel transistors 3 and 3' through the load resistors (load transistors) 1 and 1' and inverters 2 and 2', to clamp the bit lines 8 to 8' and 8" at about 1 V. To read data out of, for example, the memory cell 6, a column gate Y0 is raised to HIGH to turn ON the n-channel transistor 5, and a row gate X0 is raised to HIGH to select the memory cell 6.

If the memory cell (real cell) 6 holds data "0," the level of the bit lines will be kept at about 1 V. The bit line 8" for the reference cell 6" is also set to about 1 V through the inverter 2' and n-channel transistor 3'. The level of the bit line 8", however, is slightly lower than that of the bit lines 8 to 8' for the real cells, so that the level of a node N2 becomes lower than that of a node N1. As a result, the sense amplifier 4 detects the data "0".

If the memory cell holds data "1," the bit line 8' drops to 0 V when the column gate Y0 is raised to HIGH to turn ON the n-channel transistor 5 and when the row gate X0 is raised to HIGH. Accordingly, the level of the node N1 becomes lower than that of the node N2, and the sense amplifier 4 detects the data "1." At this time, a stress voltage is continuously applied to the drains of the memory cells 6 to 6' and 7 to 7' that are connected to the shared bit lines 8 to 8'.

In this way, the conventional semiconductor memory (flash memory) has the problem that, while data of a selected memory cell is being read, a stress voltage is continuously applied to the drains of the other unselected memory cells (MIS transistors) connected to a bit line to which the selected memory cell is connected.

The first aspect of the present invention minimizes a stress voltage applied to unselected memory cells during a read operation.

A semiconductor flash memory according to the first aspect of the present invention will be explained next with reference to FIGS. 3 to 7.

Figure 3:
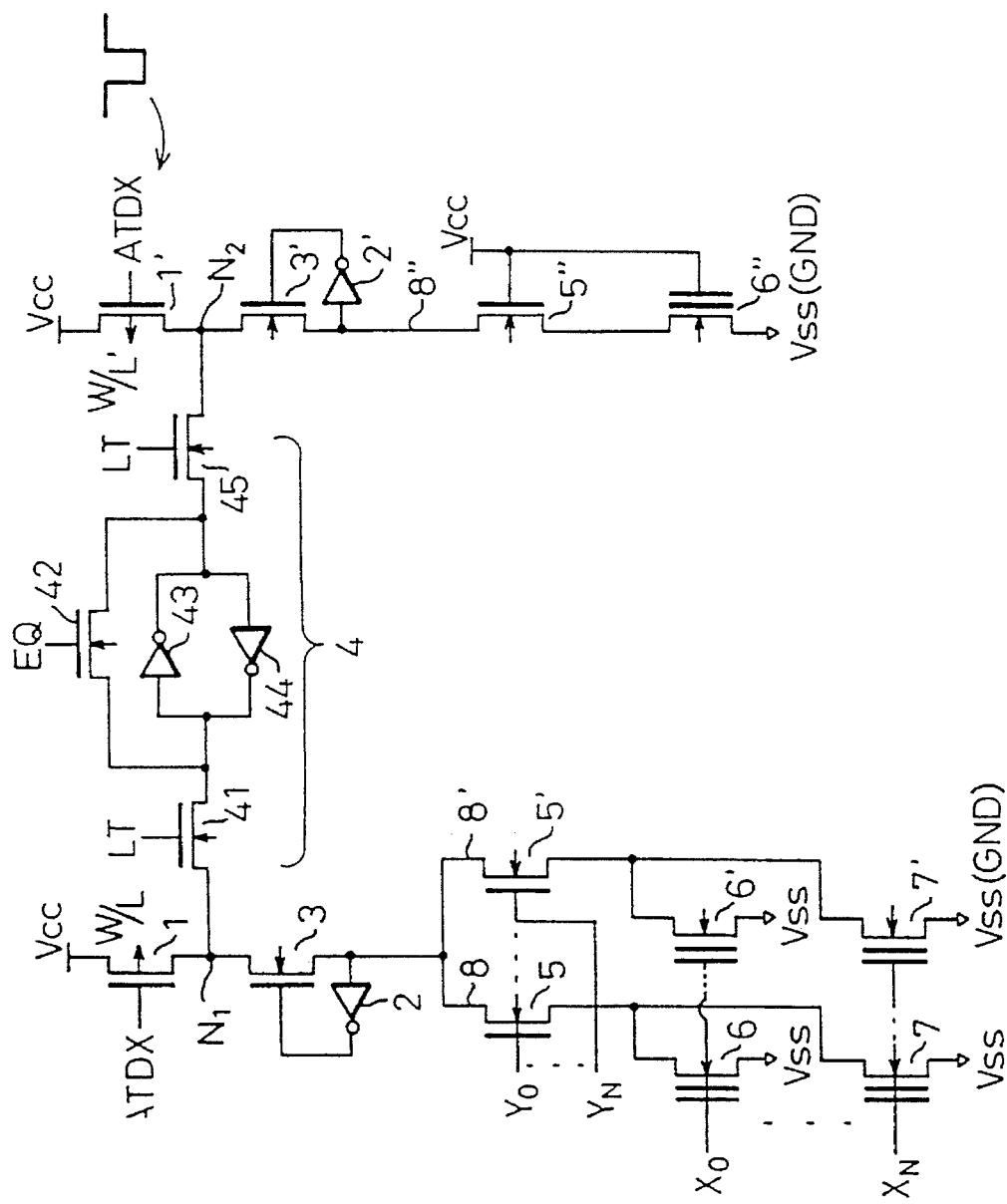
FIG. 3 is a circuit diagram showing a semiconductor memory according to the first aspect of the present invention.

FIG. 3 is a circuit diagram showing the semiconductor flash memory, in particular a sense amplifier thereof, according to the first aspect of the present invention.

The flash memory includes sense amplifier load transistors 1 and 1', inverters 2 and 2' and n-channel transistors 3 and 3' for setting a voltage of about 1 V on bit lines 8 to 8' and 8", the sense amplifier (S/A) 4, n-channel transistors 5 to 5' and 5" for selecting the bit lines, memory cells 6 to 6' for storing data, and a reference cell 6" for comparing data read out of a selected memory cell with reference data. The flash memory also includes memory cells 7 to 7', which are MIS transistors each having a floating gate, similar to the memory cells 6 to 6'. These memory cells form a memory cell array.

The sense amplifier 4 of FIG. 3 is the same as that of FIG. 2. The sense amplifier 4 has an n-channel transistor 42 for receiving an EQ signal, n-channel transistors 41 and 45 for receiving an LT signal, and a latch circuit made of inverters 43 and 44.

The embodiment of FIG. 3 is characterized in that an ATDX signal (an inverted ATD (Address Transition Detection) signal) is applied to the gates of the load transistors 1 and 1', which correspond to the load resistors 1 and 1' of the prior art of FIG. 2, to control the switching of the load transistors 1 and 1'. The other parts of FIG. 3 are the same as those of FIG. 2. The load transistors 1 and 1' are p-channel MIS transistors, which are turned ON when the ATDX signal is LOW. The reason why the ATDX signal is also supplied to the gate of the load transistor 1' for the reference cell is to maintain symmetry with the load transistor 1 for the real cells. The ATDX and ATD signals are usually used in nonvolatile semiconductor memories such as flash memories, and therefore, it is not necessary to prepare a separate ATDX signal generator for this embodiment. The other operations of the sense amplifier 4 are the same as those of the prior art of FIG. 2.

Figure 4:
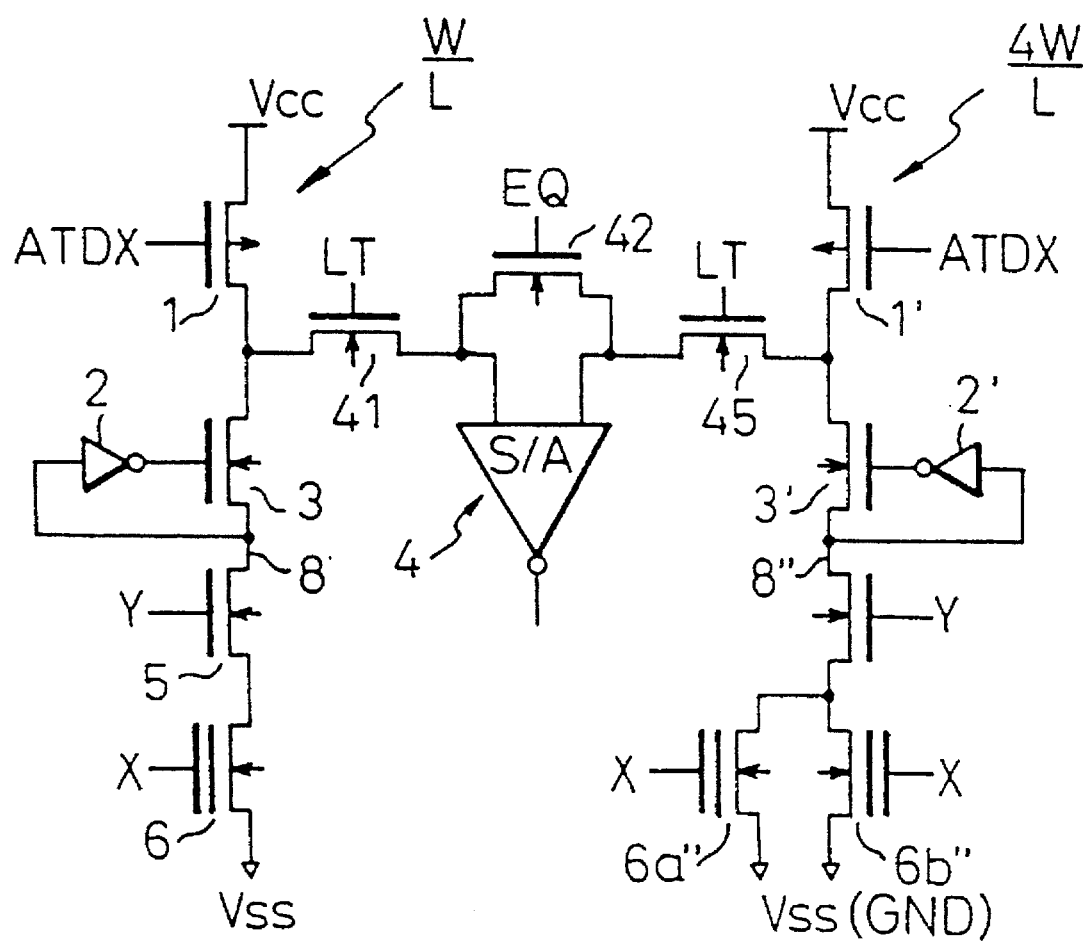
FIG. 4 shows an essential part of the semiconductor memory of FIG. 3.

FIG. 4 explains the details of the semiconductor memory of FIG. 3. Reference cells 6a" and 6b" are the same as the real cells and are arranged side by side.

The W/L ratio (the ratio of gate width to gate length) of the load transistor 1' for the reference cells is larger (for example, four times) than that of the load transistor 1 for the real cells. Accordingly, the performance of the reference cells is substantially half the performance of the real cells. Each of the reference cells 6a" and 6b" has the same structure as that of the real cell and stores data "1" in advance.

Figure 5:
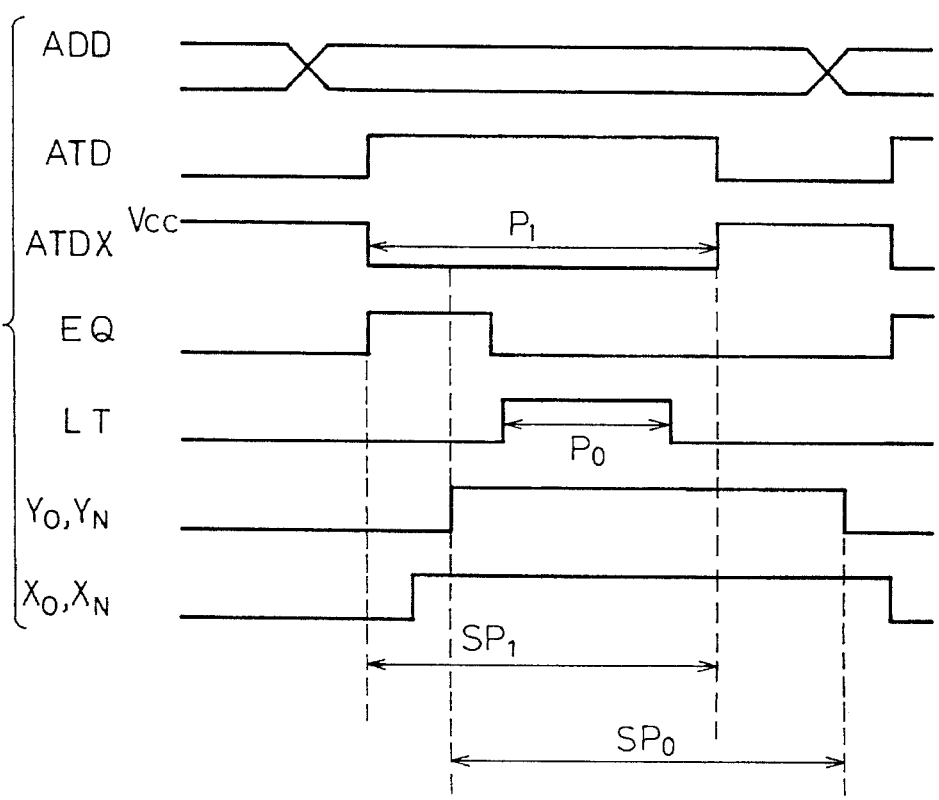
FIG. 5 is a timing chart explaining operations of the part shown in FIG. 3.

FIG. 5 is a timing chart explaining operations of the circuit of FIG. 3. When an address is provided to read data, an address signal ADD is changed accordingly. After the address signal ADD is changed, the ATD signal is kept at HIGH (Vcc) level during a period P1, and accordingly, the ATDX signal is kept at LOW level during the period P1. At the same time, the EQ signal is raised to HIGH to turn ON the transistor 42, to equalize the levels of the real and reference cells with each other before reading data. After the EQ signal is returned to LOW, the LT signal is kept HIGH during a period P0, to detect a level difference between the nodes N1 and N2. The LT signal is dropped to LOW within the period P1 during which the ATD signal is HIGH, i.e., the ATDX signal is LOW. The LT signal may be increased to HIGH before the EQ signal is returned to LOW. The LT signal is provided after one of the column gates Y0 to YN and one of the row gates X0 to XN are selected according to the address signal ADD.

In this way, when reading data in the semiconductor memory according to the embodiment, the load transistors 1 and 1' are ON only during the period in which the ATDX signal is at LOW even if selected ones of the column gates Y0 to YN and row gates X0 to XN are raised to HIGH. Namely, the drains of unselected memory cells that are connected to a bit line to which the selected memory cell is connected are subjected to a stress voltage only during a selection period SP1 (P1). Namely, a stress period SP0 of the prior art of FIG. 2 is reduced to SP1. This embodiment, therefore, greatly reduces stresses applied to the memory cells.

Figure 6:
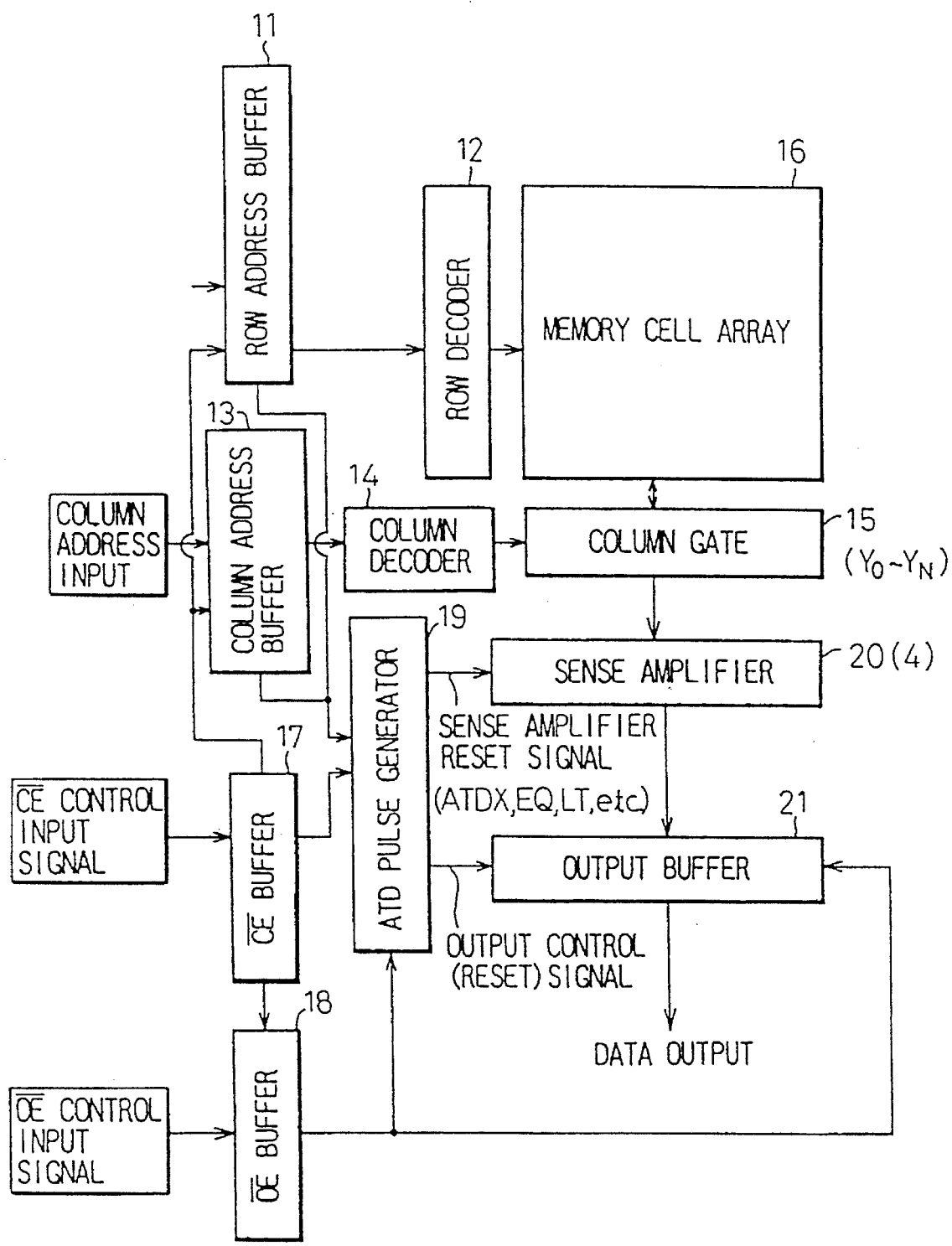
FIG. 6 is a block diagram showing the whole picture of the semiconductor memory according to the first aspect of the present invention.

FIG. 6 is a block diagram showing the whole picture of the semiconductor memory according to the first aspect of the present invention.

The memory has a row address buffer 11 for receiving an input row address and a chip control signal, a row decoder 12, a column address buffer 13 for receiving an input column address and the chip control signal, a column decoder 14, a column gate 15 (Y0 to YN), and a memory cell array 16. The memory also has a /CE buffer 17 for providing the chip control signal in response to a chip enable control signal (/CE), a /OE buffer 18 for providing an output control signal in response to an output enable control signal (/OE), an ATD pulse generator 19, a sense amplifier 20 (4), and an output buffer 21. The ATD pulse generator 19 provides the sense amplifier 20 with the ATDX signal, EQ signal, and LT signal mentioned above.

Figure 7A:
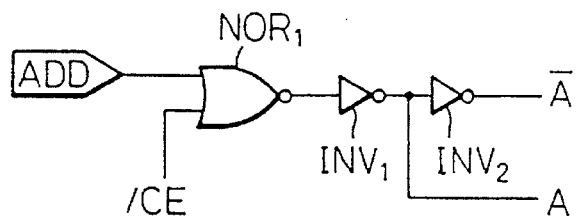
FIGS. 7A to 7C show control signal generators in the semiconductor memory of FIG. 3.
Figure 7B:
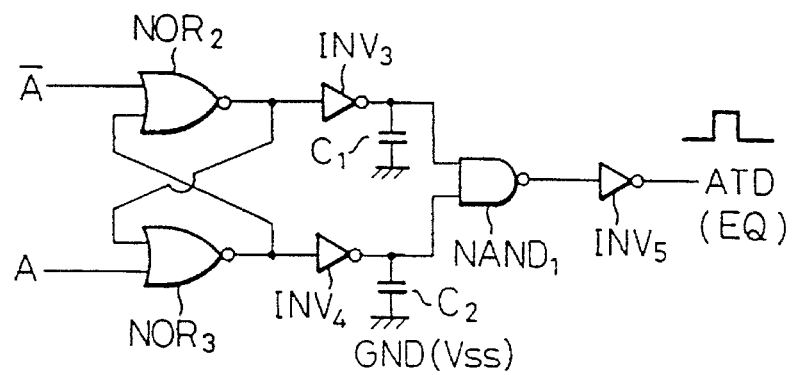
Figure 7C:
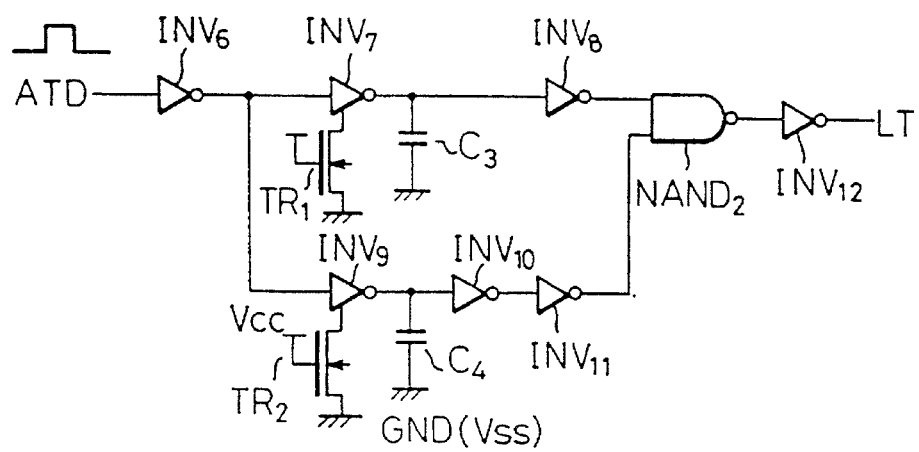

FIGS. 7A to 7C show signal generators for generating control signals for the circuit of FIG. 3. The generator of FIG. 7A generates A and /A signals in the address buffer, the generator of FIG. 7B generates the ATD (ATDX) signal, and the generator of FIG. 7C generates the LT signal.

The generator of FIG. 7A has a NOR gate NOR1 and inverters INV1 and INV2, to logically process the address signal ADD and chip enable signal /CE and provide the signals A and /A.

The ATD signal generator of FIG. 7B has NOR gates NOR1 and NOR2, a NAND gate NAND1, inverters INV3, INV4, and INV5, and capacitors C1 and C2. In response to the output signals A and /A from the address buffer circuit, the ATD signal generator generates the ATD signal indicating an address change.

The LT signal generator of FIG. 7C has a NAND gate NAND2, inverters INV6 to INV12, n-channel MIS transistors TR1 and TR2, and capacitors C3 and C4. In response to the ATD signal, the LT signal generator generates the LT signal.

It is possible to employ other generators to generate the signals mentioned above.

As explained above, the prior art continuously applies a stress voltage to the drains of unselected memory cells that are connected to a bit line to which a selected memory cell from which data is read is connected. On the other hand, the first aspect of the present invention employs an ATD pulse signal to control load transistors of a semiconductor memory, to thereby reduce a stress voltage applied to the drains of unselected memory cells. This results in improving the reliability of data stored in the memory cells.

Next, the second aspect of the present invention will be explained. First, however, a prior art corresponding to the second aspect of the present invention and the problems thereof will be explained.

Figure 8:
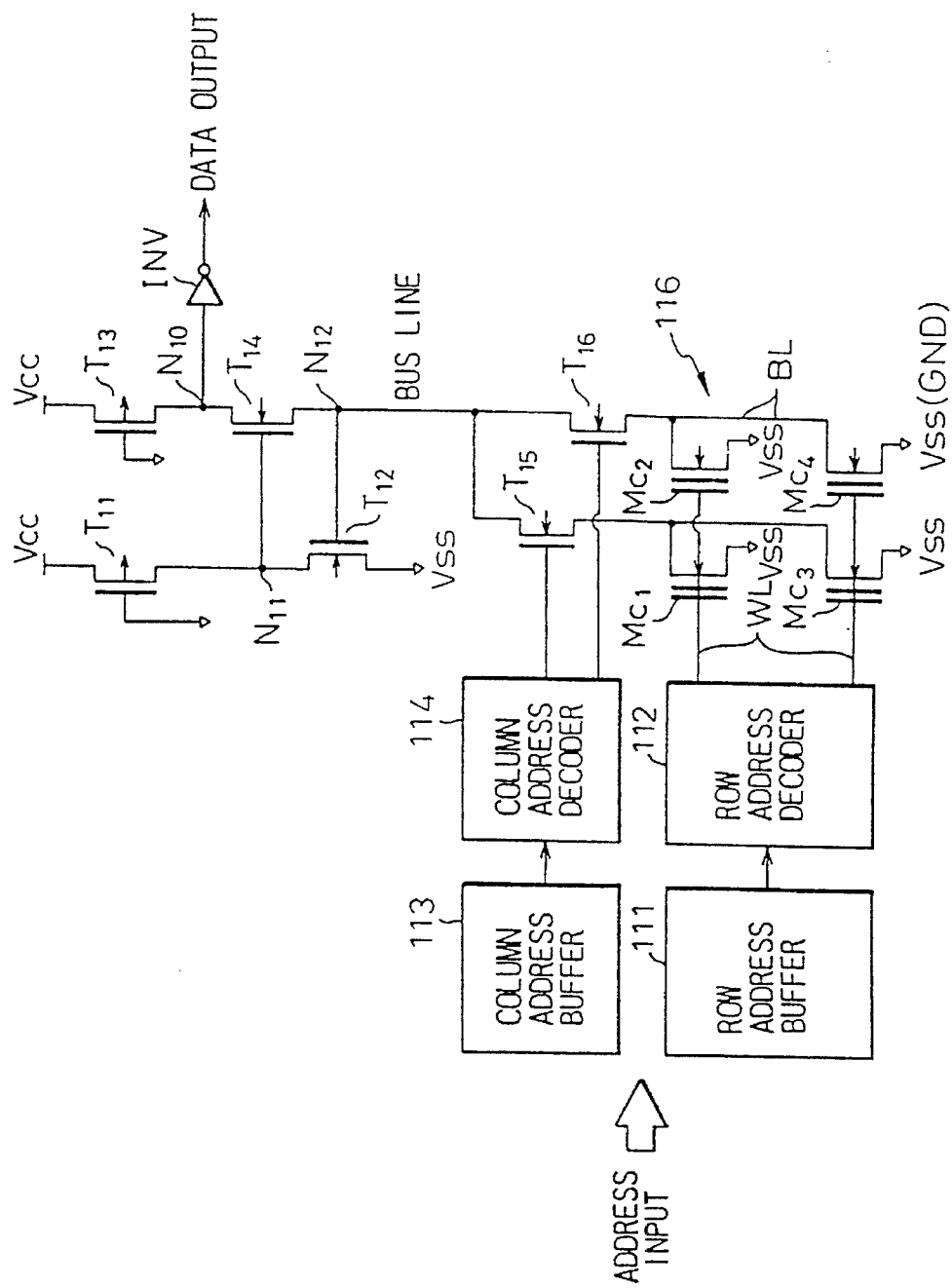
FIG. 8 is a circuit diagram showing a semiconductor memory according to a prior art corresponding to the second aspect of the present invention.

FIG. 8 is a circuit diagram showing a semiconductor memory according to the prior art corresponding to the second aspect of the present invention. The memory includes a row address buffer 111, a row address decoder (a row decoder) 112, a column address buffer 113, and a column address decoder (a column decoder) 114.

The column decoder 114 selects a bit line BL and the row decoder 112 selects a word line WL, to connect one of cell transistors MC1 to MC4 to a data decision circuit, which involves p-channel MIS transistors T11 and T12 and n-channel MIS transistors T13 and T14. The transistors T11, T12, and T14 form a bias circuit for maintaining a constant voltage on the bit lines BLs. Read data is provided outside through a node N10 between the transistors T13 and T14 and an inverter INV.

Figure 9A:
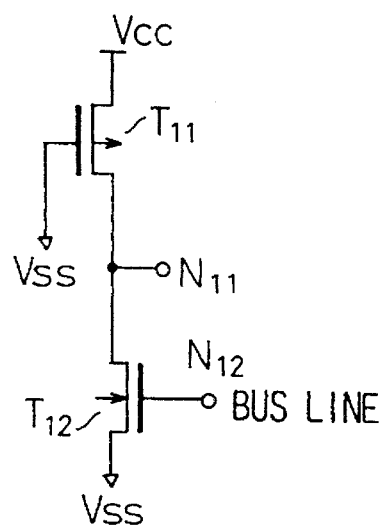
FIGS. 9A and 9B are circuit diagrams showing essential parts of the semiconductor memory of FIG. 8.
Figure 9B:
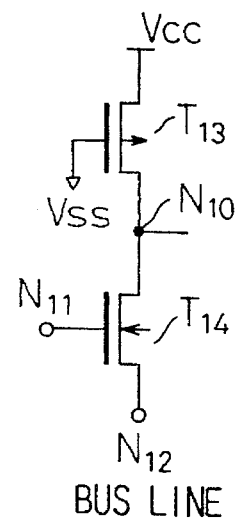
Figure 10:
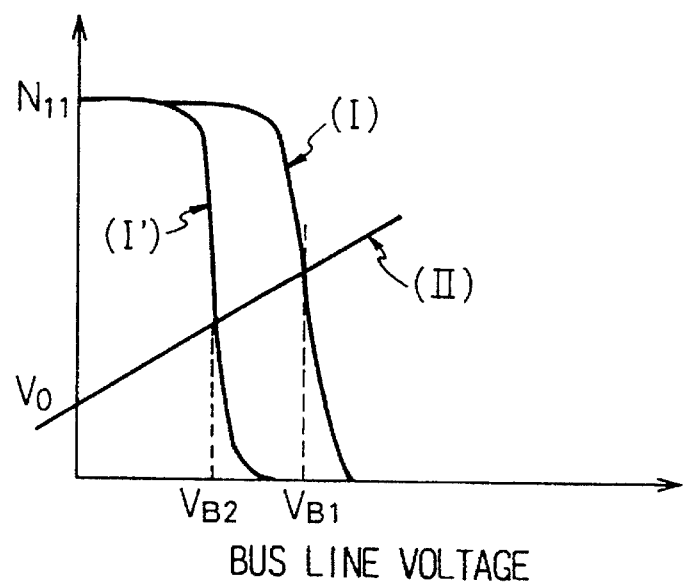
FIG. 10 shows the characteristics of the parts shown in FIGS. 9A and 9B.

FIGS. 9A and 9B are circuit diagrams showing essential parts of the semiconductor memory of FIG. 8, and FIG. 10 shows the characteristics of the circuits shown in FIGS. 9A and 9B. The data decision circuit of FIG. 8 is made of the part shown in FIG. 9A involving the transistors T11 and T12 and the part shown in FIG. 9B involving the transistors T13 and T14. A characteristic curve (I) of FIG. 10 represents the part of FIG. 9A, and a characteristic curve (II) represents the part of FIG. 9B.

Figure 11:
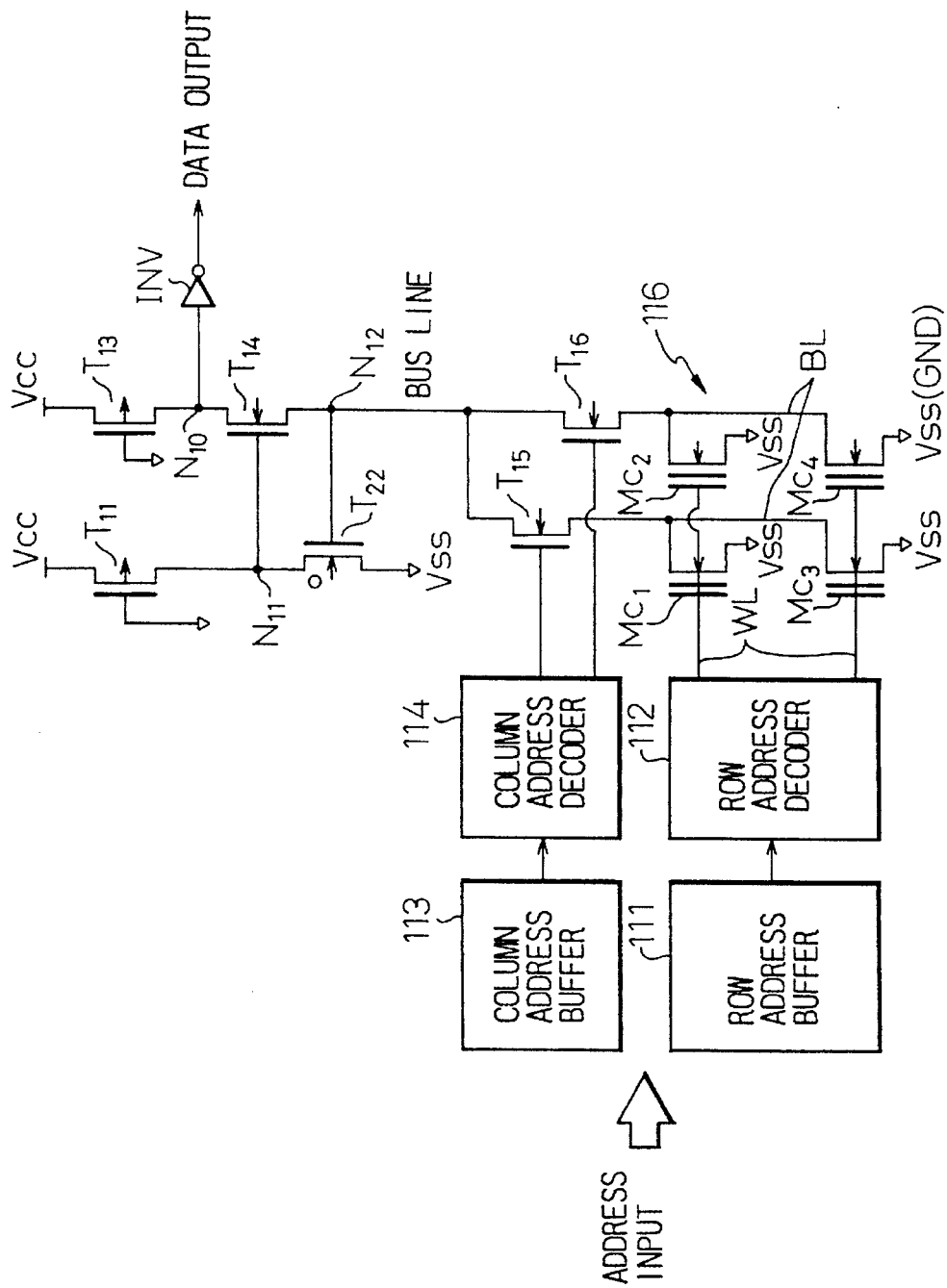
FIG. 11 is a circuit diagram showing a semiconductor memory according to the second aspect of the present invention.

A bus line voltage at a node N12 of FIG. 11 is represented with an intersection of the characteristic curves (I) and (II). Namely, the bus line voltage is "VB1" in FIG. 10. When the threshold of the transistor T12 is lowered, the characteristic curve (I) of the part of FIG. 9A will be changed to the characteristic curve (I'), to change the bus line voltage from VB1 to VB2.

In FIG. 9B, the transistor T13 serves as a load element to determine data stored in a cell transistor. When the drain current of a selected cell transistor is greater than a current flowing through the load element, the node N10 provides a low level output, and if not, the node N10 provides a high level output.

The threshold voltage of the transistor T12 is usually about 0.6 V. This voltage is incidentally convenient for setting a bus line voltage of 1 V. The sizes of cell transistors are reduced year by year, and accordingly, a voltage for reading data must be lowered.

An EPROM is a typical nonvolatile semiconductor memory. To write data into a selected memory cell in the EPROM, electrons are injected into the floating gate of the selected memory cell. The EPROM must hold the data even after a power source is cut. The data stored in the memory cell is read by testing whether the memory cell passes a current (data "1") or not (data "0"). If the floating gate of some memory cell has a defect of leaking electrons, the cell is unable to hold data.

Even if a memory cell is provided with a sound oxide film, electrons caught in the floating gate of the memory cell sometimes escape because of production unevenness in the oxide film.

The escaping of electrons in a semiconductor memory depends on the kind and degree of defects in the memory. To screen defective semiconductor memories before shipment, a temperature acceleration test and an operation test are carried out. The temperature acceleration test leaves an objective semiconductor memory at a high temperature to accelerate the aging of data stored in memory cells of the memory.

These tests, however, involve many steps and take a long time because recent semiconductor memories have large capacity. The tests, therefore, increase the cost of the semiconductor memories.

As is apparent in FIGS. 9A, 9B, and 10, reducing a drain voltage to read data may be easily realized by employing a low threshold transistor achieving the characteristic curve (I'), as the transistor T12. Simply fabricating the low threshold transistor, however, increases the number of processes thus increasing cost.

The second aspect of the present invention provides a semiconductor memory that achieves a low drain voltage to read data without increasing production processes and cost.

The semiconductor memory according to the second aspect of the present invention will be explained next with reference to FIGS. 11 to 13.

In FIG. 11, the semiconductor memory has transistors T11, T22, T13, and T14 and an inverter INV. These transistors and inverter correspond to the transistors T11, T12, T13, and T14 and inverter INV of FIGS. 9A and 9B. The semiconductor memory also has a row address buffer 111, a row address decoder (row decoder) 112, a column address buffer 113, a column address decoder (column decoder) 114, gate transistors T15 and T16, and cell transistors MC1 to MC4. These components are the same as those of FIG. 8. A bus line voltage in the semiconductor memory is a voltage at a node N12.

According to the embodiment of FIG. 11, the transistor T22 is a natural transistor having a low threshold voltage. Unlike the transistor T12 of the prior art of FIG. 8 having channel control, the natural transistor T22 of FIG. 11 has no channel control, to reduce the threshold voltage. The natural transistor T22 has a threshold voltage of about 0 V to easily achieve a low bus line voltage of about 0.2 V. The natural transistor T22 can be fabricated without increasing the number of processes.

Figure 12A:
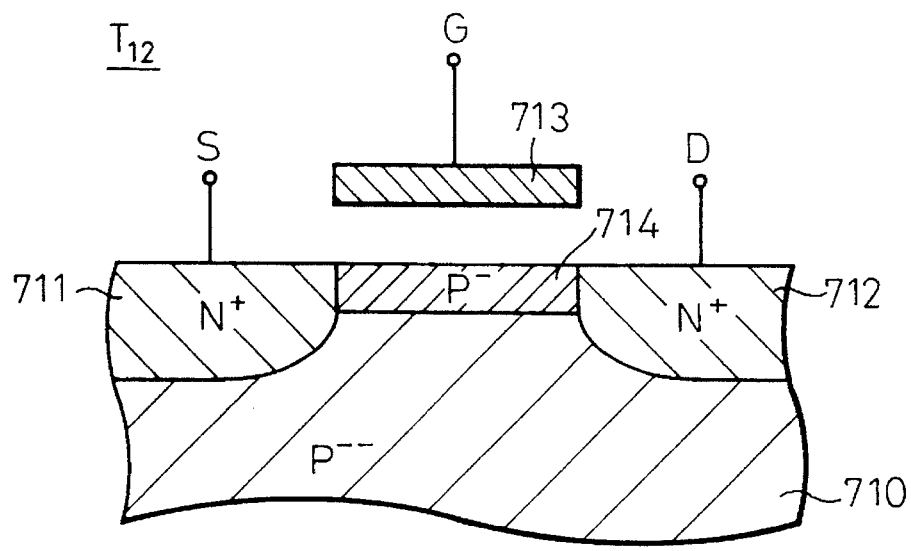
FIGS. 12A and 12B show a conventional transistor and a transistor employed in the circuit of the present invention of FIG. 11.
Figure 12B:
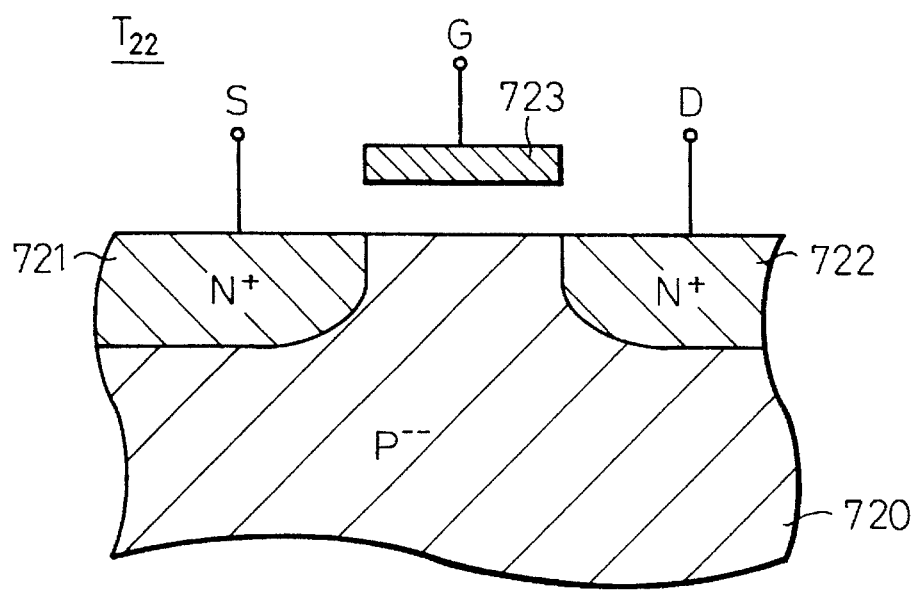

FIG. 12A is a sectional view showing the transistor T12 having channel control of the prior art of FIG. 8, and FIG. 12B is a sectional view showing the transistor T22 having no channel control of the embodiment of the present invention of FIG. 11. The transistors T12 and T22 are n-channel MIS transistors.

In FIG. 12A, the transistor T12 of the prior art has a p⁻ substrate 710 containing n⁺ impurity regions to form a source 711 and a drain 712. A p⁻ channel control region is formed on the surface of the p⁻ substrate 710 opposite to a gate 713.

In FIG. 12B, the natural transistor T22 of the present invention has a p⁻ substrate 720 containing n⁺ impurity regions to form a source 711 and a drain 712. The natural transistor T22 has no channel control region, unlike the transistor T12 of FIG. 12A. The surface of the p⁻ substrate 710 opposite to a gate 723 is the p⁻ substrate 710 itself. As a result, the natural transistor T22 has a threshold voltage of about 0 V to lower the bus line voltage to about 0.2 V. Accordingly, the semiconductor memory employing the natural transistor T22 according to the present invention demonstrates the characteristic curve (I') of FIG. 10.

Figure 13:
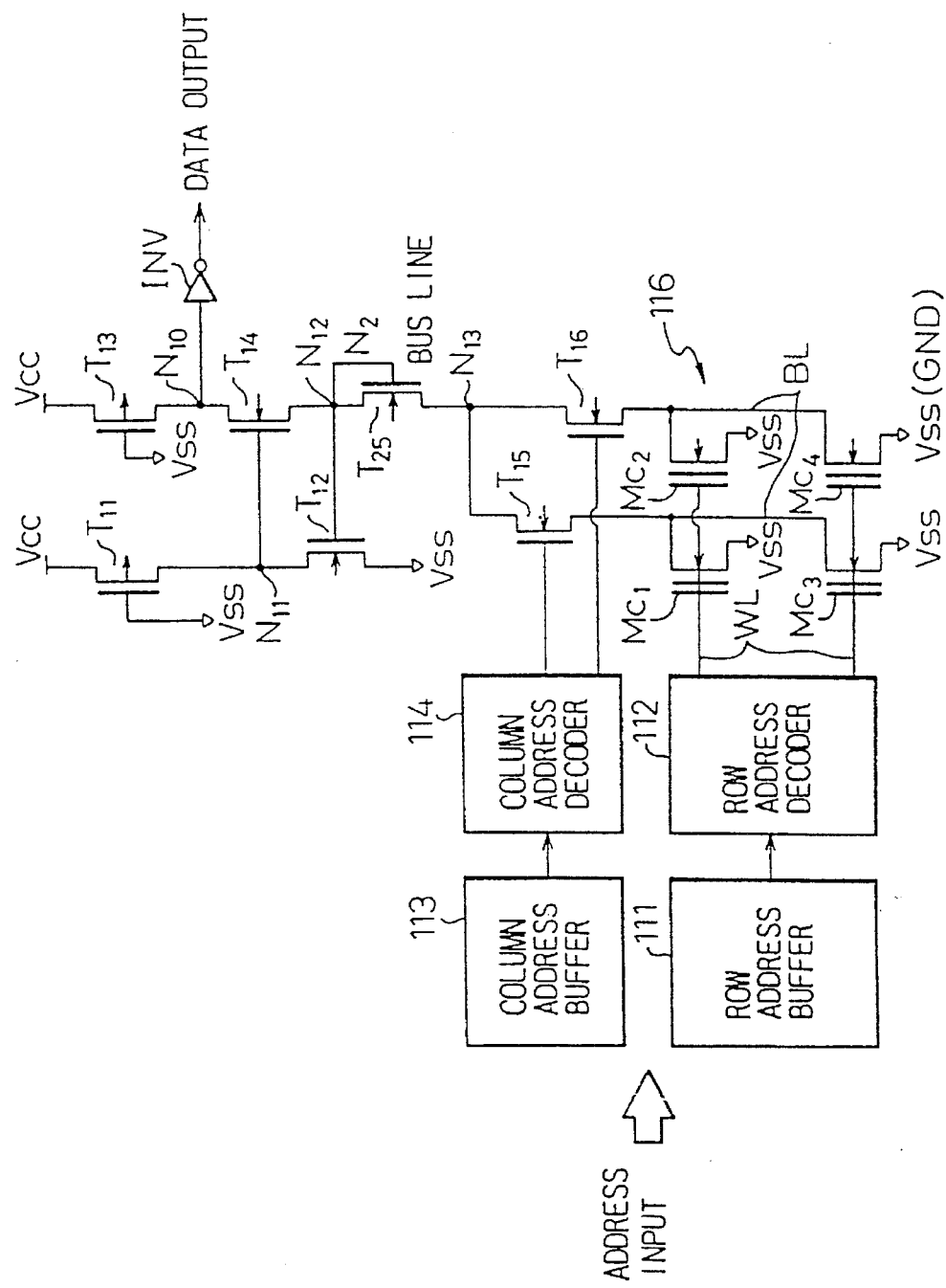
FIG. 13 is a circuit diagram showing another semiconductor memory according to the second aspect of the present invention.

FIG. 13 is a circuit diagram showing another semiconductor memory according to the second aspect of the present invention.

This memory is characterized in that an n-channel MIS transistor T25 is disposed between the source (node N12) of a transistor T14 and a bus line (node N13). Other components such as a row address buffer 111, a row decoder 112, a column address buffer 113, a column decoder 114, gate transistors T15 and T16, and cell transistors MC1 to MC4 are the same as those of the prior art of FIG. 8. A bus line voltage of this embodiment is a voltage at the node N13.

The transistor T25 of FIG. 13 added to the conventional circuit of FIG. 8 reduces the bus line voltage applied to the constant voltage node N12 by the threshold voltage of the transistor T25, to realize the characteristic curve (I') of FIG. 10.

As explained above, the second aspect of the present invention lowers a drain voltage to read data without increasing the number of processes and secures reliable operations even in a semiconductor memory having very fine cell transistors.

Next, the third aspect of the present invention will be explained. First, however, a prior art corresponding to the third aspect of the present invention and the problems thereof will be explained.

Figure 14:
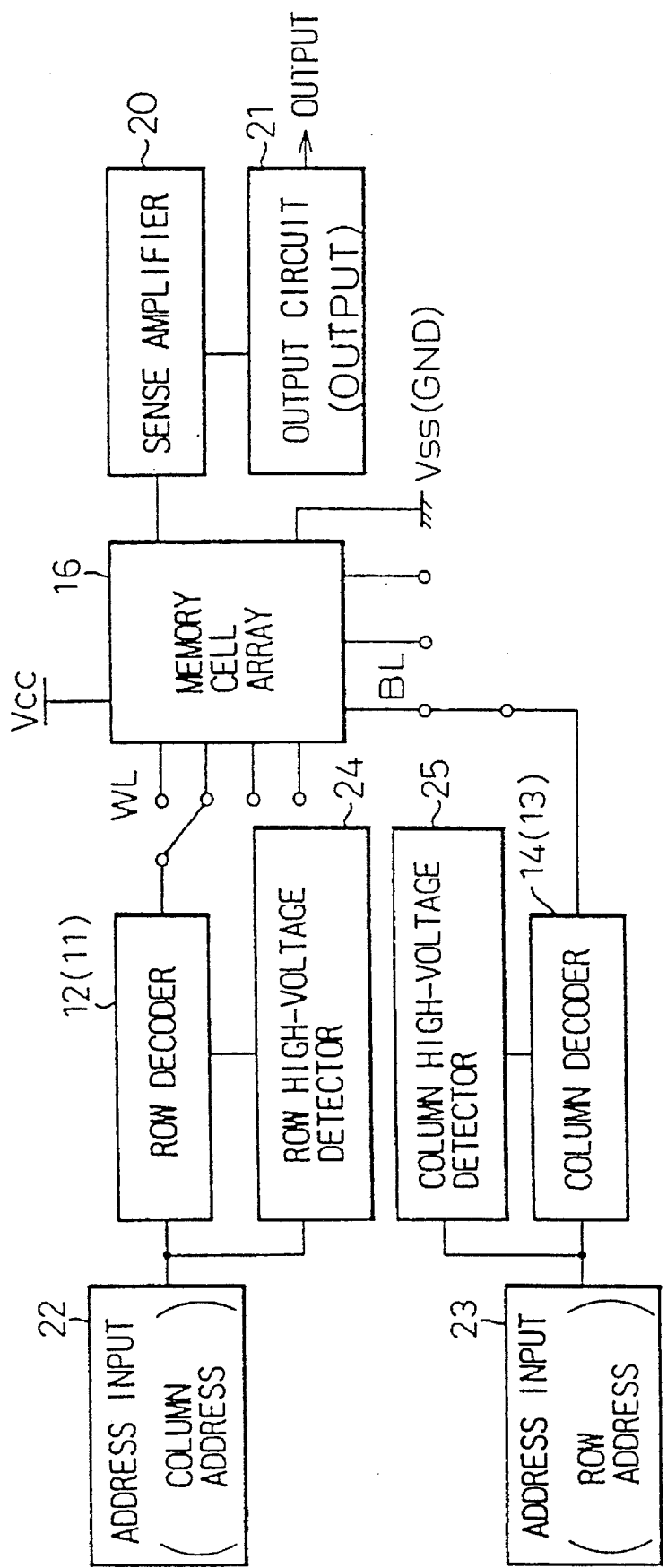
FIG. 14 is a block diagram showing a semiconductor memory under a normal mode according to a prior art corresponding to the third aspect of the present invention.
Figure 15:
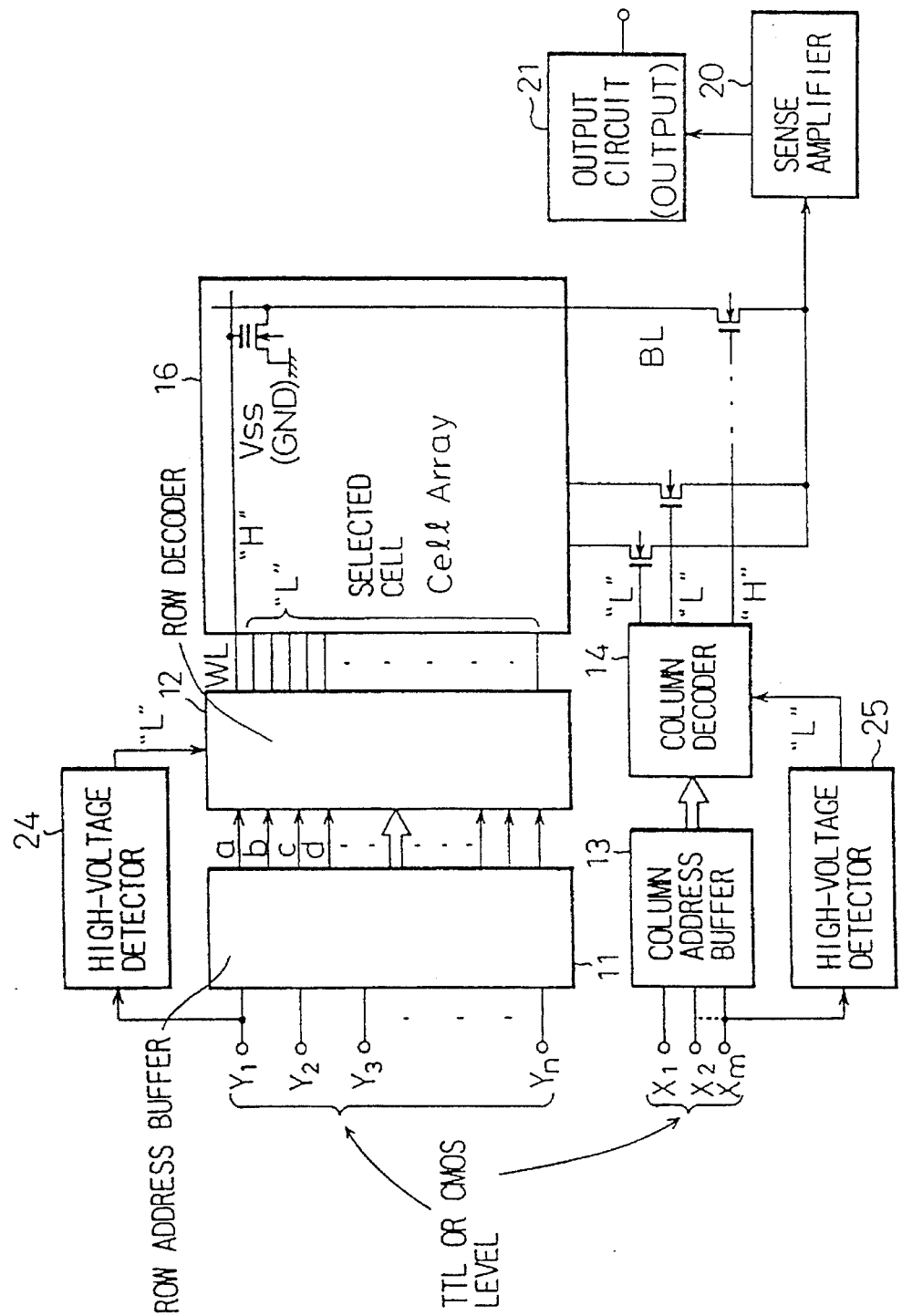
FIG. 15 is a detailed circuit diagram showing the semiconductor memory of FIG. 14 under the normal mode.
Figure 16:
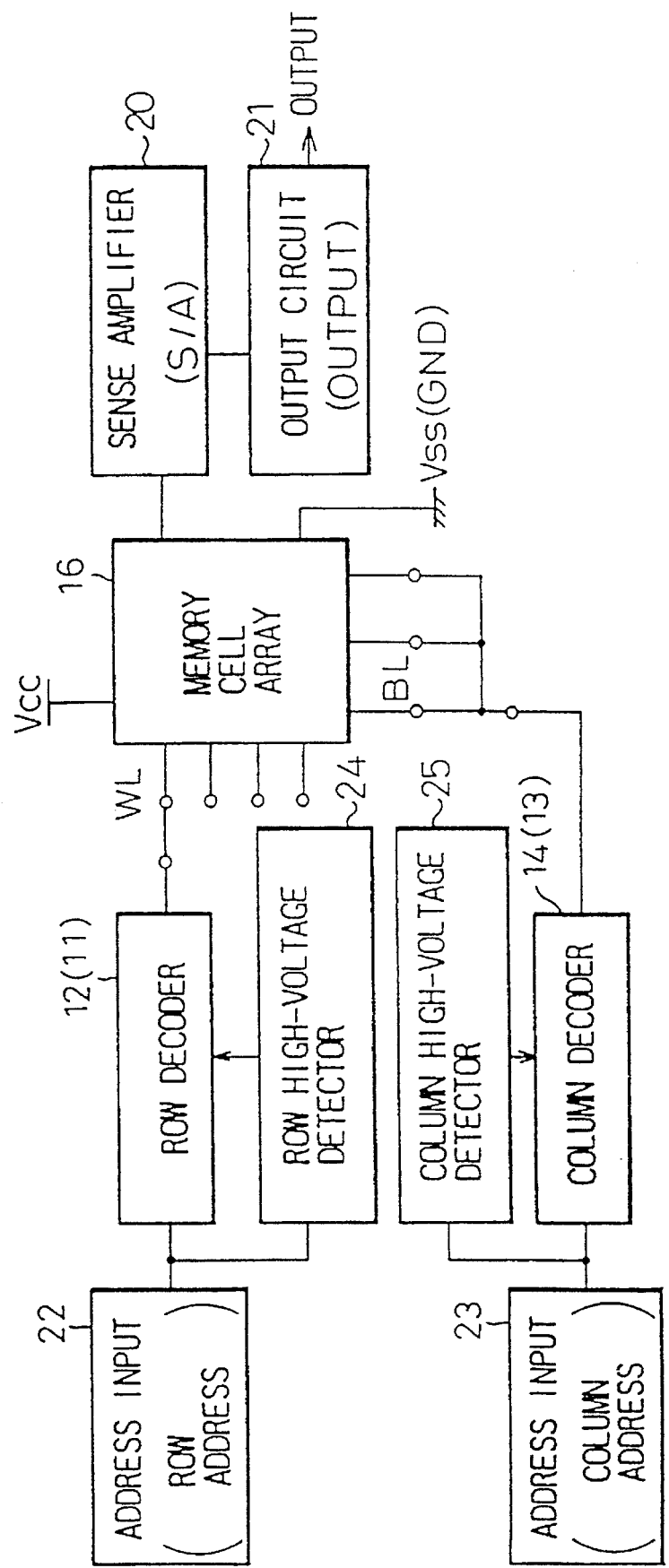
FIG. 16 is a block diagram showing the semiconductor memory under a high-voltage mode according to the prior art corresponding to the third aspect of the present invention.
Figure 17:
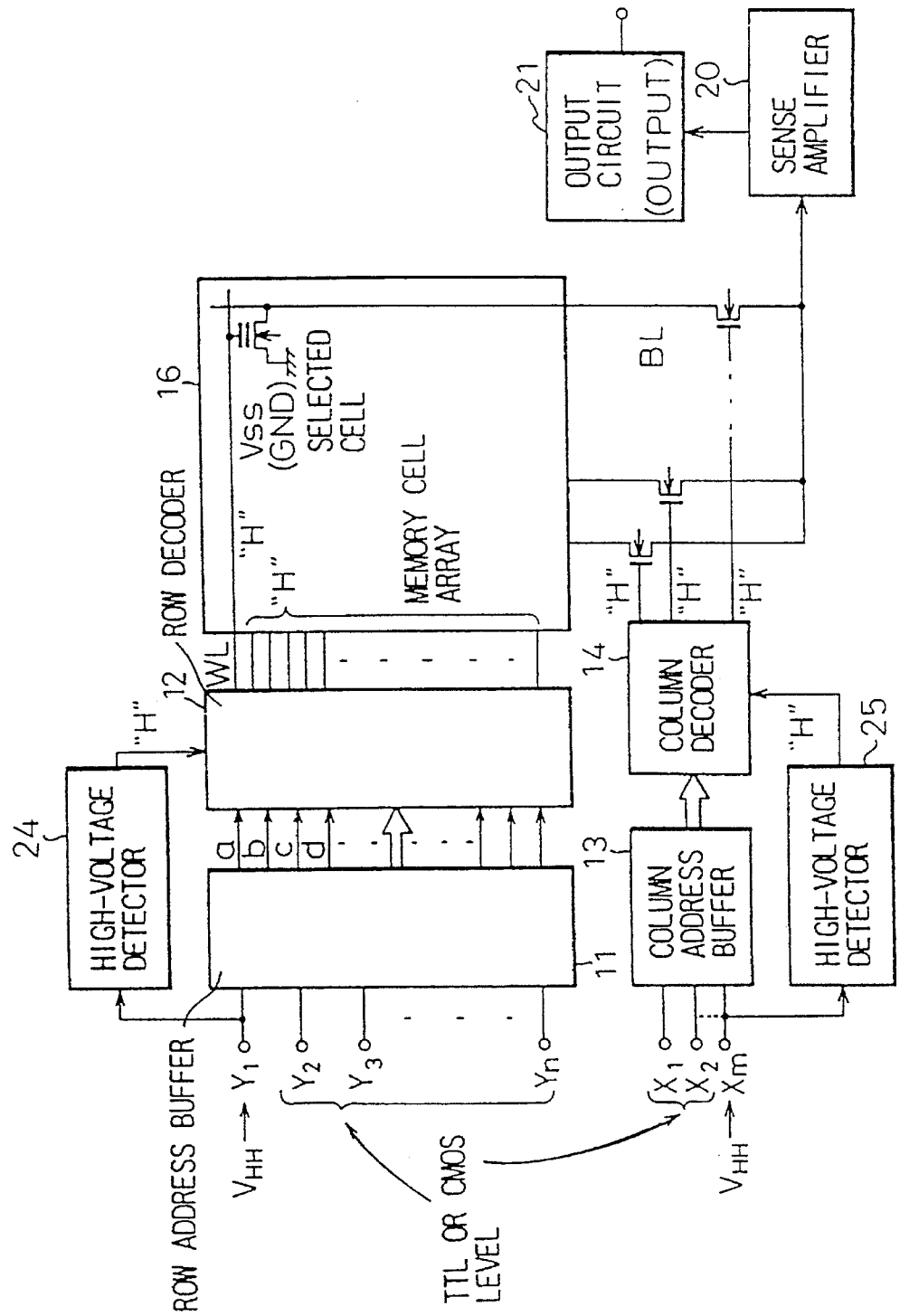
FIG. 17 is a detailed circuit diagram showing the semiconductor memory of FIG. 16 under the high-voltage mode.

FIG. 14 is a block diagram showing a semiconductor memory (an EPROM) under a normal mode according to the prior art corresponding to the third aspect of the present invention, FIG. 15 is a detailed circuit diagram showing the semiconductor memory of FIG. 14 under the normal mode, FIG. 16 is a block diagram showing the semiconductor memory of FIG. 14 under a high-voltage mode, and FIG. 17 is a detailed circuit diagram showing the semiconductor memory of FIG. 16 under the high-voltage mode.

In FIGS. 14 to 17, the EPROM has a row address input 22 with terminals Y1 to Yn for receiving a row address, a column address input 23 with terminals X1 to Xm for receiving a column address, a row address buffer 11, a row decoder 12, a row high-voltage detector 24, a column address buffer 13, a column decoder 14, a column high-voltage detector 25, a memory cell array 16, a sense amplifier 20, and an output circuit 21. In FIGS. 14 and 16, the row address buffer 11 is included in the row decoder 12, and the column address buffer 13 is included in the column decoder 14. In FIGS. 15 and 17, the row high-voltage detector 24 is connected to the row address input terminal Y1, and the column high-voltage detector 24 is connected to the column address input terminal Xm.

Under the normal mode of FIGS. 14 and 15, row and column address inputs are each at TTL or CMOS level. The row address is supplied to the memory cell array 16 through the row address buffer 11 and row decoder 12, to select a word line in the memory cell array 16. The column address is supplied to the memory cell array 16 through the column address buffer 13 and column decoder 14, to select a bit line in the memory cell array 16. A memory cell is thus selected according to the row and column addresses, and the content of the selected memory cell is provided outside through the sense amplifier 20 and output circuit 21.

In FIGS. 16 and 17, a high voltage VHH of, for example, about +12 V higher than a standard voltage level (TTL or CMOS level) is supplied to the predetermined row address signal input terminal Y1. The row high-voltage detector 24 detects this high voltage and starts a special mode. The same high voltage is supplied to the predetermined column address signal input terminal Xm. The column high-voltage detector 25 detects this high voltage and starts the special mode. The above predetermined terminals are called multiple selection terminals, which are used to surely and effectively carry out the special mode (test mode).

When the high voltage VHH is applied to the multiple selection row terminal Y1 and multiple selection column terminal Xm, the row high-voltage detector 24 detects the high voltage VHH and sets all word lines to HIGH. At the same time, the column high-voltage detector 25 detects the high voltage VHH and sets all bit lines to HIGH, thereby selecting all column gates. As a result, all memory cells in the memory cell array 16 are selected.

Figure 18:
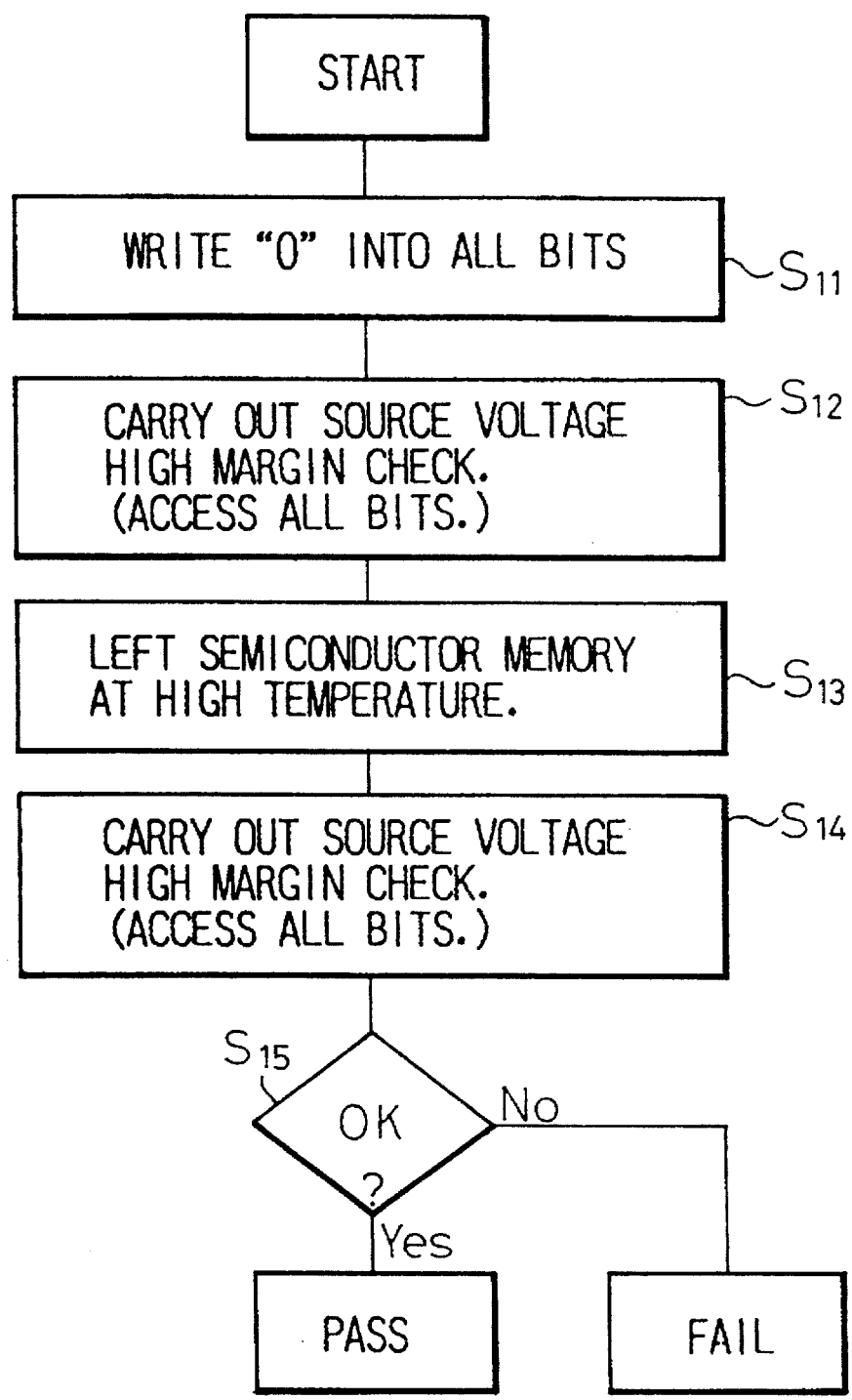
FIG. 18 is a flowchart showing semiconductor memory testing steps carried out in the semiconductor memory according to the prior art corresponding to the third aspect of the present invention.

FIG. 18 is a flow chart showing semiconductor memory testing (screening) processes carried out in the semiconductor memory according to the prior art corresponding to the third aspect of the present invention.

Step S11 writes data "0" in every bit (memory cell).

Step S12 increases a source voltage (Vcc) higher than a prescribed value, to carry out a Vcc high-margin check to access all memory cells (bits) and read data therefrom.

Step S13 leaves the semiconductor memory at a high temperature. Namely, the step S13 provides all the memory cells with high temperature stress to accelerate the temperature aging of data stored in the cells.

Step S14 increases the source voltage higher than the prescribed value, similar to step S12, to access all the memory cells and read data therefrom, to thereby again carry out the Vcc high-margin check.

Step S15 compares the measurements of the steps S12 and S14 with each other. If they agree with each other, it is determined that the semiconductor memory is acceptable, and the next test is carried out on the memory, or the memory is shipped as a product. If they do not agree with each other, the semiconductor memory is rejected as defective.

In this way, the semiconductor memory testing (screening) method according to the prior art accesses all memory cells (bits) in the steps S12 and S14 and compares measurements with each other in the step S15.

The prior art of FIG. 18 carries out the high-margin check in the steps S12 and S14 before and after leaving an objective semiconductor memory at a high temperature in the step S13. As the capacity of EPROMs increases year by year, such a prior art screening (testing) method takes more time and involves more steps, to thereby increase cost.

The third aspect of the present invention tests a semiconductor memory through a small number of processes in a short time.

A semiconductor memory according to the third aspect of the present invention will be explained with reference to FIGS. 19 to 25.

Figure 19:
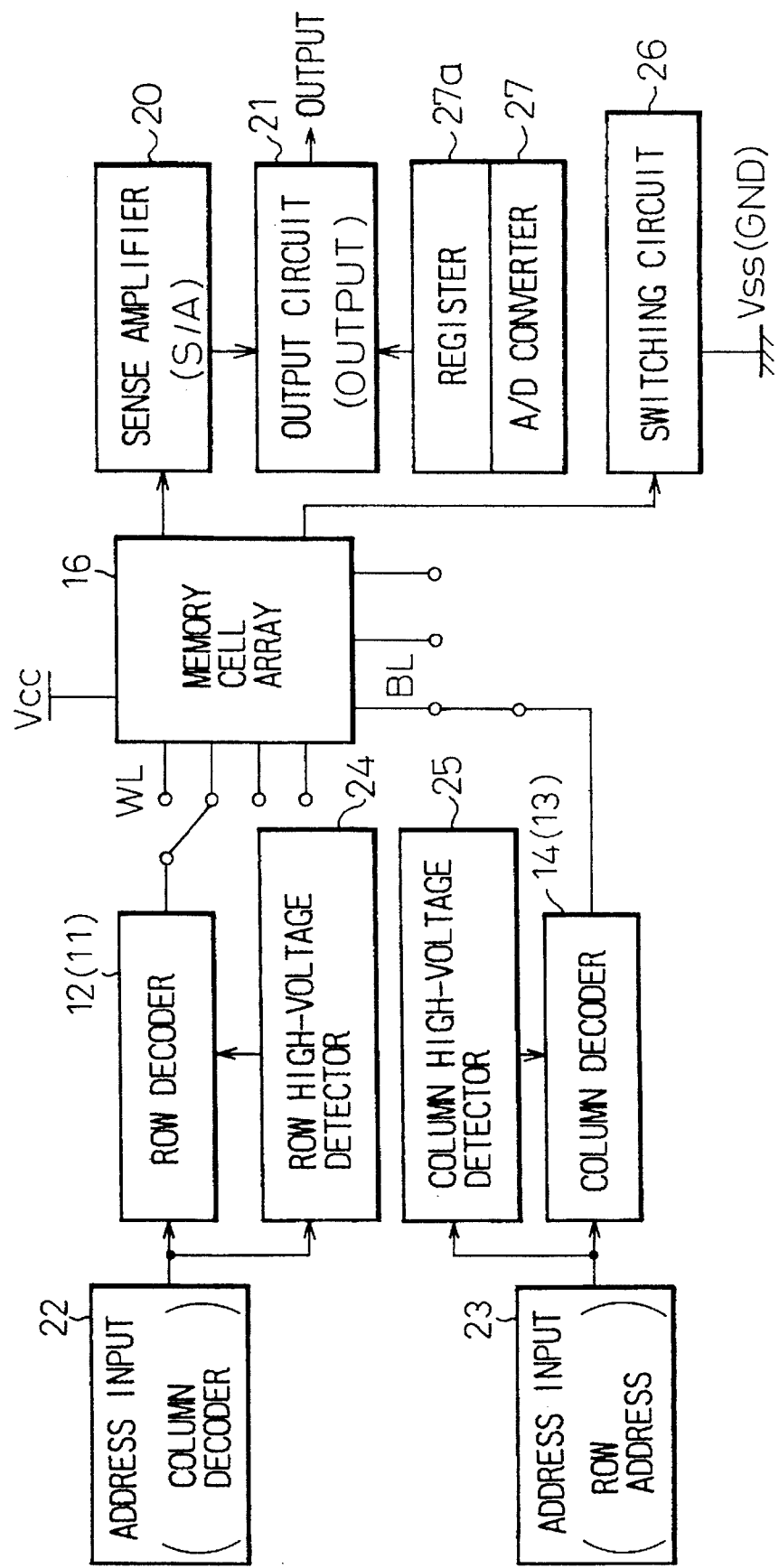
FIG. 19 is a block diagram showing a semiconductor memory under a normal mode according to the third aspect of the present invention.
Figure 20:
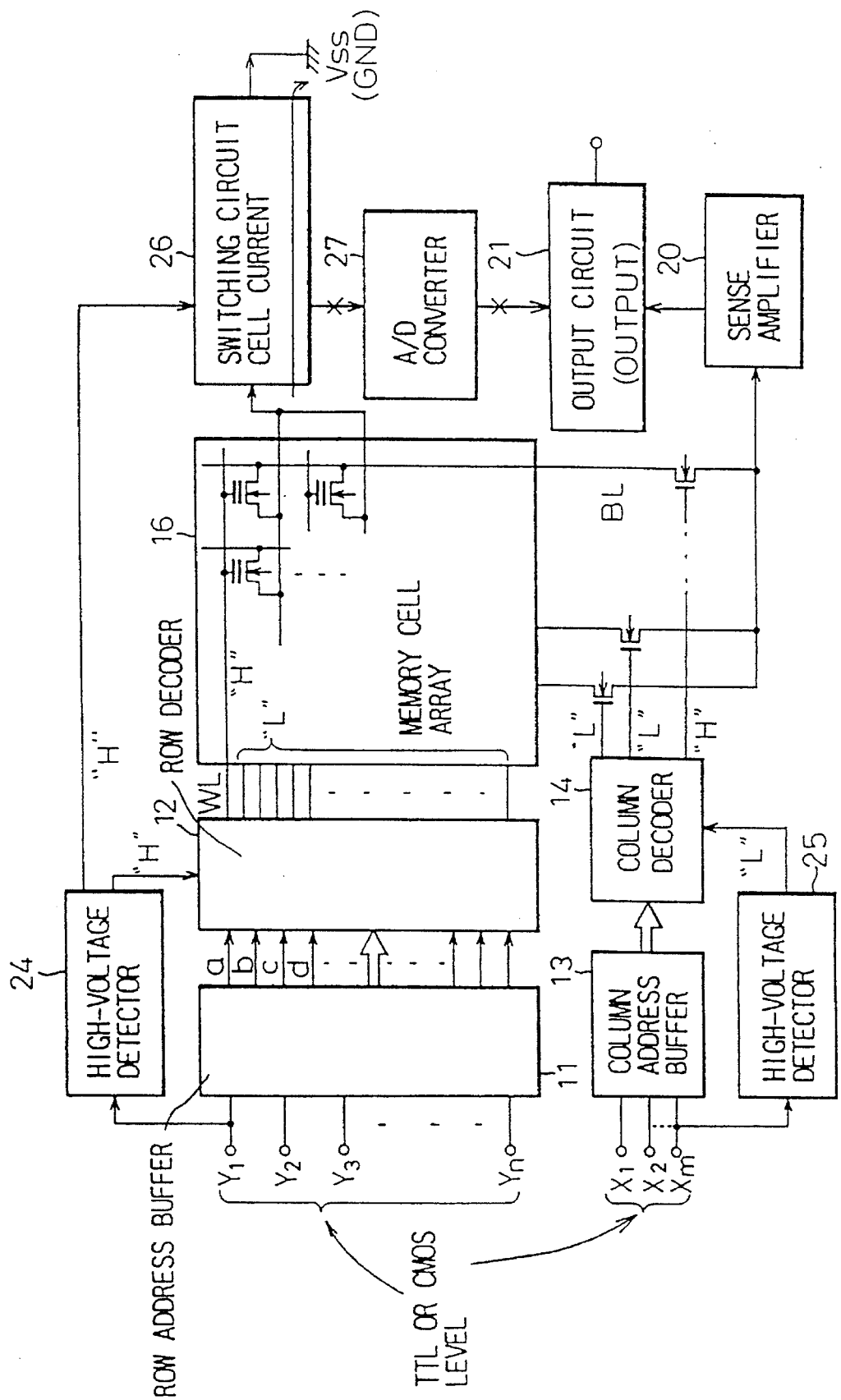
FIG. 20 is a detailed circuit diagram showing the semiconductor memory of FIG. 19 under the normal mode.
Figure 21:
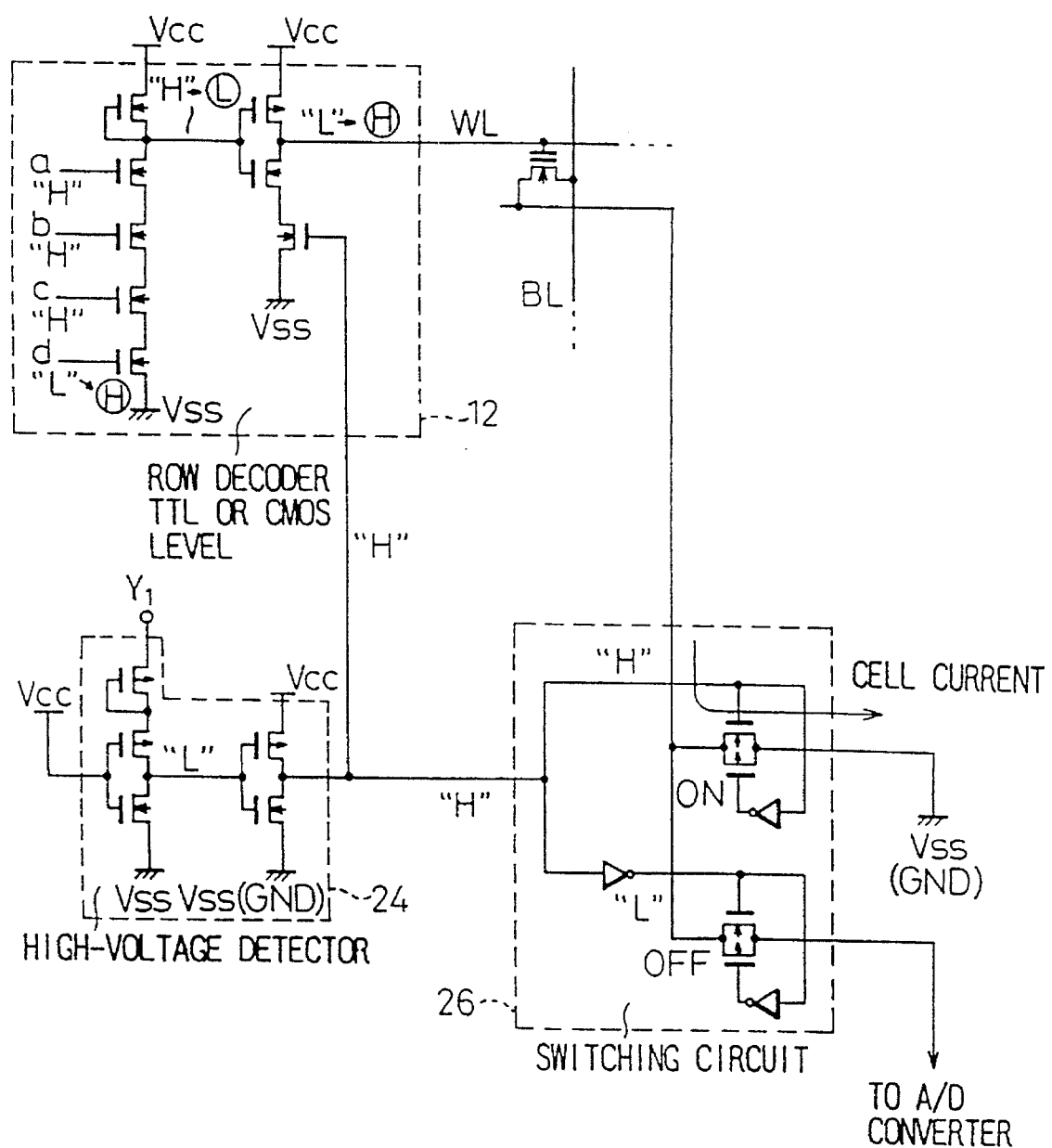
FIG. 21 explains operations of the semiconductor memory of FIG. 20 under the normal mode.
Figure 22:
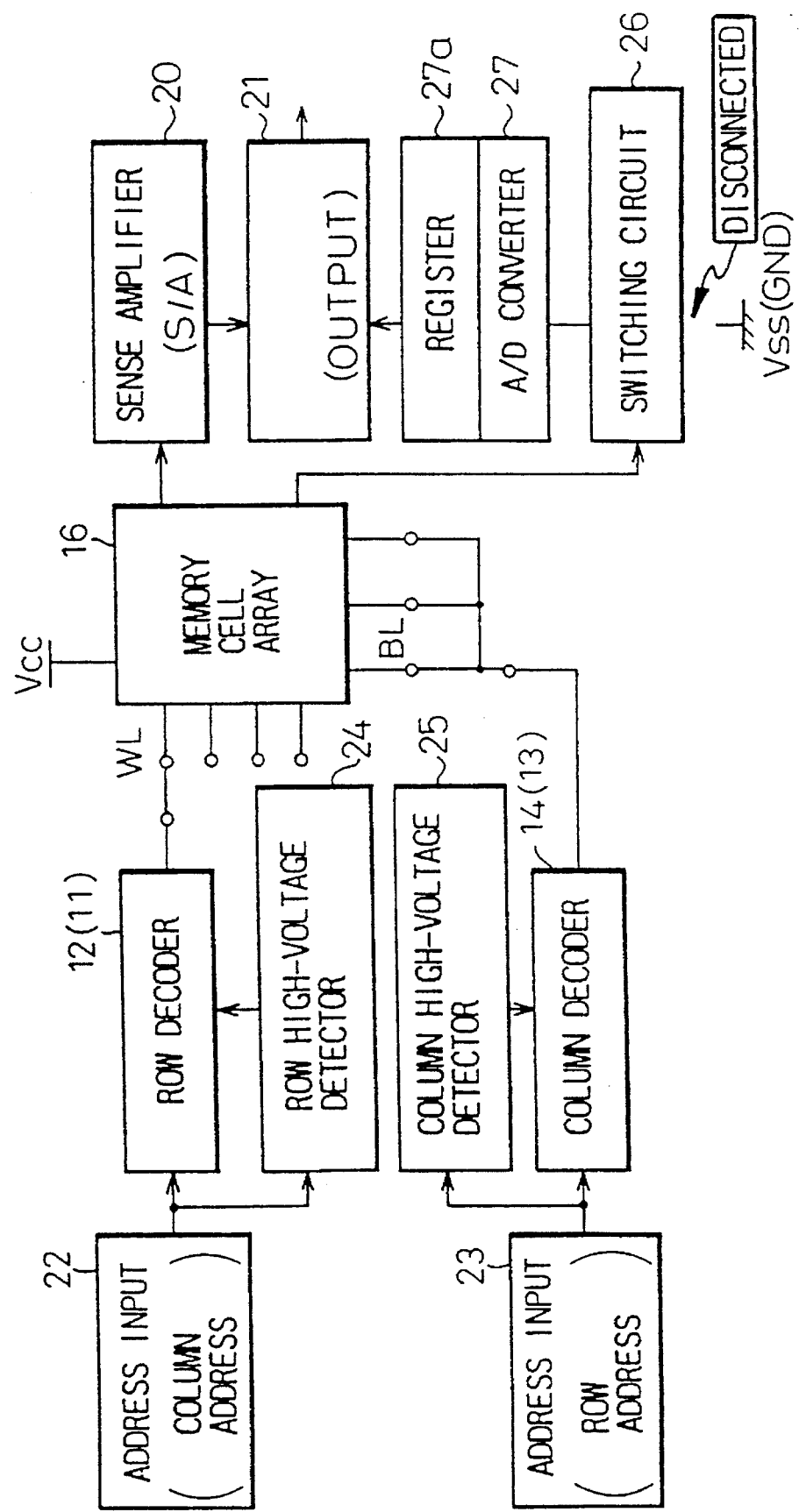
FIG. 22 is a block diagram showing the semiconductor memory under a high-voltage mode according to the third aspect of the present invention.
Figure 23:
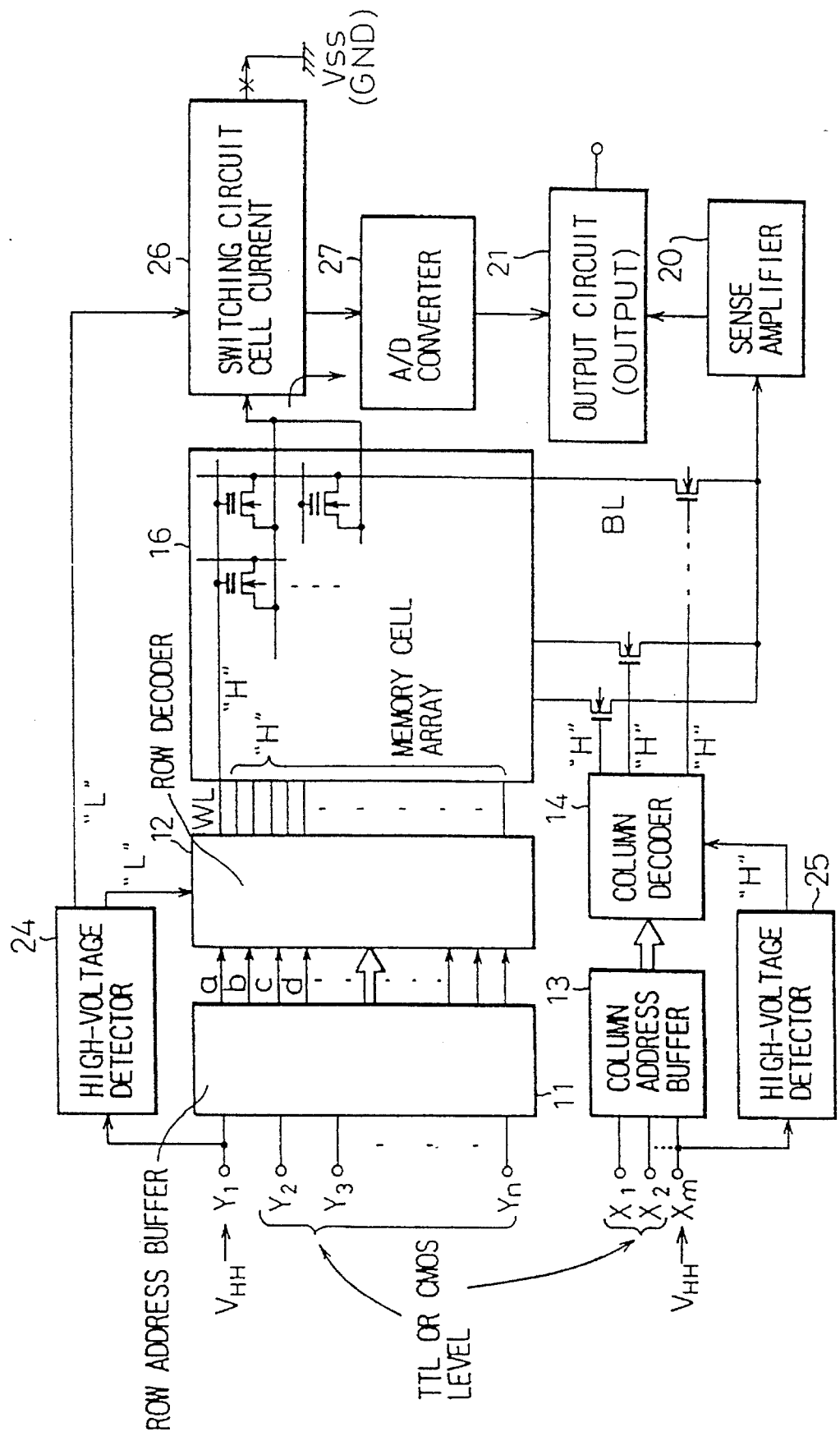
FIG. 23 is a detailed circuit diagram showing the semiconductor memory of FIG. 22 under the high-voltage mode.

FIG. 19 is a block diagram showing the semiconductor memory under a normal mode according to the third aspect of the present invention, FIG. 20 is a detailed circuit diagram showing the semiconductor memory of FIG. 19 under the normal mode, and FIG. 21 explains operations of the semiconductor memory of FIG. 20 under the normal mode. FIG. 22 is a block diagram showing the semiconductor memory under a high-voltage mode according to the third aspect of the present invention, FIG. 23 is a detailed circuit diagram showing the semiconductor memory of FIG. 22 under the high-voltage mode, and FIG. 24 explains operations of the semiconductor memory of FIG. 23 under the high-voltage mode. The third aspect of the present invention is applicable for nonvolatile semiconductor memories such as EPROMs, EEPROMs, and flash memories.

FIGS. 19 to 22 correspond to FIGS. 14 to 17. As is apparent from the comparison between these figures, the third aspect of the present invention provides the conventional semiconductor memory of FIGS. 14 to 17 with a switching circuit 26 and an analog/digital (A/D) converter 27. The other parts of the semiconductor memory according to the third aspect of the present invention are the same as those of the conventional semiconductor memory of FIGS. 14 to 17.

In FIGS. 19 and 22, a reference mark 27a is a register for storing a cell current converted by the A/D converter 27.

In FIGS. 19 to 23, the semiconductor memory (EPROM) has a row address input 22 with terminals Y1 to Yn for receiving a row address, a column address input 23 with terminals X1 to Xm for receiving a column address, a row address buffer 11, a row decoder 12, a row high-voltage detector 24, a column address buffer 13, a column decoder 14, a column high-voltage detector 25, a memory cell array 16, a sense amplifier 20, and an output circuit 21. In FIGS. 19 and 22, the row address buffer 11 is included in the row decoder 12, and the column address buffer 13 is included in the column decoder 14. In FIGS. 20 and 23, the row high-voltage detector 24 is connected to the row address input terminal Y1, and the column high-voltage detector 24 is connected to the column address input terminal Xm.

Under the normal mode of FIGS. 19 to 21, row and column addresses each at TTL or CMOS level are provided. The row address is supplied to the memory cell array 16 through the row address buffer 11 and row decoder 12, to select a word line in the memory cell array 16. The column address is supplied to the memory cell array 16 through the column address buffer 13 and column decoder 14, to select a bit line in the memory cell array 16. Accordingly, a memory cell is selected with the row and column addresses, and the content of the selected memory cell is provided outside through the sense amplifier 20 and output circuit 21.

In FIG. 21, the high-voltage detector 24 connected to the row address input terminal Y1 provides, under the normal mode, a high level output. In this case, the switching circuit 26 passes a current (a cell current) flowing through the memory cell array 16 to the ground.

Figure 24:
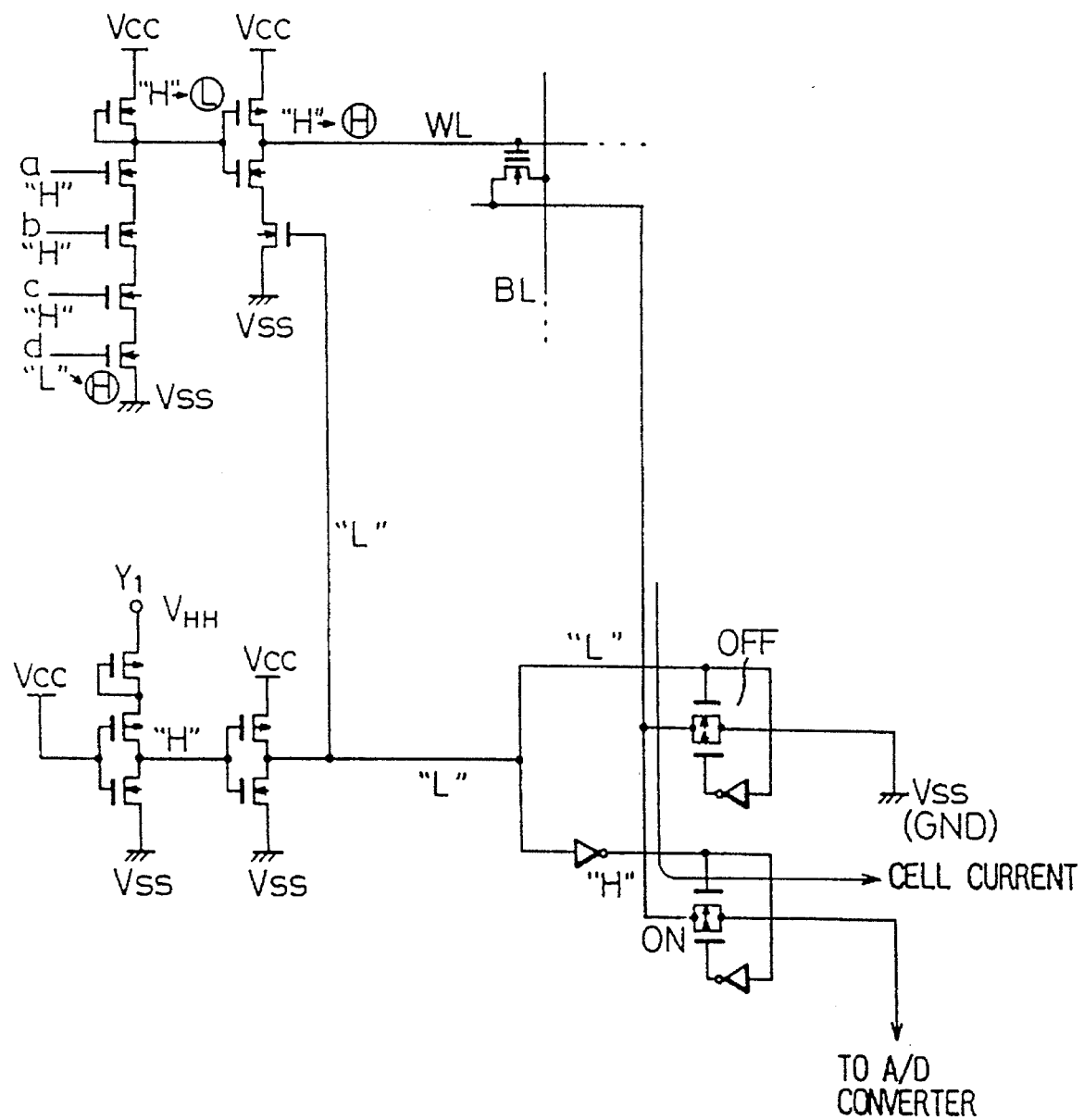
FIG. 24 explains operations of the semiconductor memory of FIG. 23 under the high-voltage mode.

In FIGS. 22 to 24, a high voltage VHH of, for example, about +12 V higher than a standard voltage level (TTL or CMOS level) is supplied to the predetermined multiple selection terminal Y1 on the row address buffer side. The row high-voltage detector 24 detects this high voltage and starts a special mode (a cell current measuring mode). The high voltage is also supplied to the predetermined multiple selection terminal Xm on the column address buffer side. The column high-voltage detector 25 detects this high voltage, selects all word lines, and provides a signal to the switching circuit 26 to measure a cell current flowing through the memory cell array 16.

when the high voltage VHH is applied to the terminals Y1 and Xm, the row high-voltage detector 24 detects the high voltage VHH at the terminal Y1 and sets all word lines to HIGH. At the same time, the column high-voltage detector 25 detects the high voltage VHH at the terminal Xm and selects all column gates (all bit lines). As a result, all memory cells in the memory cell array 16 are selected. When the high-voltage is applied, a switching circuit control signal from the high-voltage detector 24 connected to the terminal Y1 becomes LOW as shown in FIG. 24. In response to this control signal, the switching circuit 26 passes a cell current flowing through the memory cell array 16 to the A/D converter 27.

Namely, when the high voltage VHH is applied to the terminal Y1, all memory cells are selected. At this time, a cell current passing through the memory cells is not directly grounded but supplied to the A/D converter 27. The cell current is A/D-converted by the A/D converter 27 and is supplied outside through the output circuit (output terminal) 21, or is stored in the internal register 27a.

To write data to a given memory cell in an EPROM, electrons are injected into the floating gate of the memory cell. The data stored in the memory cell is determined to be 1 or 0 depending on whether or not the memory cell passes a current. The semiconductor memory testing method according to the third aspect of the present invention detects changes in data stored in memory cells according to a current passing through the memory cells after exposing the memory cells to a high temperature.

A current passing through memory cells is expressed as follows:

$$i = i1 \times n + i0 \times m + \alpha$$

were i1 is a current passing through a cell holding data "1," i0 is a current passing through a cell holding data "0," n is the number of cells each keeping data "1," m is the number of cells each keeping data "0," and $\alpha$ is a very small leakage (substantially zero).

If electrons in the floating gates of some cells each holding data "0" escape, the data held in these cells will be changed from "0" to "1." A current i' after exposing the memory cells to a high temperature is expressed as follows:

$$i' = i1 \times (n+F) + i0 \times (m-F) + \beta$$

where F is the number of cells whose data have been changed and $\beta$ is a very small leakage (substantially zero).

Comparing the currents i and i' with each other will ireveal changes in the data. Although cells each holding data "0" more or less cause a very small leakage, this leakage can be ignored. The currents i and i' to be compared with each other may be provided outside or stored inside the semiconductor memory.

In this way, the third aspect of the present invention tests a semiconductor memory through a small number of steps in a short time.

Figure 25:
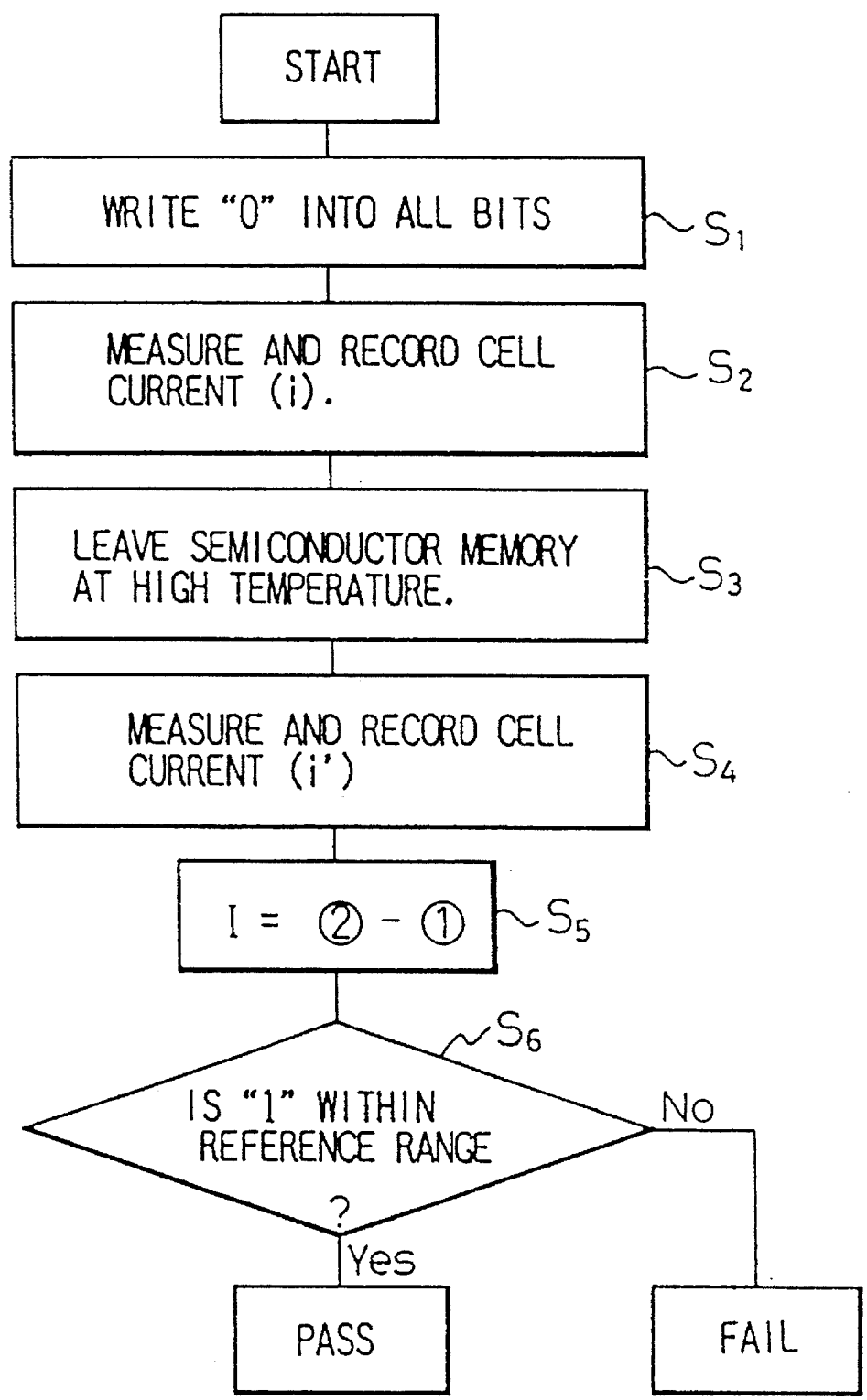
FIG. 25 is a flowchart showing semiconductor memory testing steps carried out in the semiconductor memory according to the third aspect of the present invention.

FIG. 25 is a flowchart showing the semiconductor memory testing (screening) steps according to the third aspect of the present invention. These steps test the data holding characteristics of an array of memory cells of a semiconductor memory with use of the all word line selection function and all bit line selection function of multiple selection terminals of the semiconductor memory.

Step S1 writes data "0" to every bit (memory cell) of the semiconductor memory to be tested.

Step S2 selects all cells with use of the function of the multiple selection terminals and measures and records a cell current flowing through the memory cell array (16).

Step S3 leaves the semiconductor memory at a high temperature to apply high temperature stress to every memory cell and accelerate the aging of the data stored in the memory cells.

Step S4 selects all cells with use of the function of the multiple selection terminals and measures and records a cell current flowing through the memory cell array, similar to the step S2.

Steps S5 and S6 compare the cell currents measured in the steps S2 and S4 with each other. If they agree with each other within a predetermined range, it is determined that the semiconductor memory is acceptable, and the next test is carried out on the memory, or the memory is shipped as a product. If the steps S5 and S6 determine that the difference between the cell currents measured in the steps S2 and S4 is out of the predetermined range, the semiconductor memory is determined to be defective and is abandoned.

When any one of the steps S2 and S4 measures a cell current, the high voltage VHH is applied to the multiple selection row and column terminals Y1 and Xm, to select all memory cells, and the switching circuit 26 is controlled to supply the cell current to the A/D converter 27, which may provide the cell current outside through the output circuit (output terminal) 21, or store the cell current in the internal register 27a. The cell currents measured in the steps S2 and S4 are compared with each other to determine whether or not they are allowable according to reference values, which are prepared in advance according to a guaranteed data holding period and fluctuations in data.

This embodiment writes data "0" into every memory cell. Accordingly, there will be substantially no cell current before the temperature acceleration is carried out. If some cells come to have data "1" after the temperature acceleration, these cells will pass current, to increase the cell current measured in the step S4. If there are no cells that have data "1" after the temperature acceleration, the cell currents measured in the steps S2 and S4 will be equal to each other.

The steps S2 and S4 may employ a power source current passing through the semiconductor memory instead of the cell current. When the high voltage VHH is applied to the multiple selection terminals to select all memory cells, a power source voltage is directly applied to the memory cell array. This is the reason why the power source current is employable instead of the cell current. Measured currents may be externally recorded or stored in an internal register.

Unlike the conventional testing (screening) method that accesses all cells of a semiconductor memory, to test the performance of the memory, the method according to the third aspect of the present invention is easy to carry out and is completed within a short time. If the steps S2 and S4 employ a power source current flowing through a semiconductor memory to be tested instead of a cell current, there will be no need to change the circuitry of the semiconductor memory.

As explained above, the third aspect of the present invention applies a high voltage (VHH) to the multiple selection terminals (Y1, Xm) of a semiconductor memory to be tested, to select all memory cells before and after a temperature acceleration step, controls a switching circuit (26) to supply a cell current to an A/D converter (27), and measures and records the converted cell current. The cell currents measured before and after the temperature acceleration step are compared with each other, to determine the quality of the semiconductor memory. The third aspect of the present invention, therefore, tests semiconductor memories through a small number of steps in a short time.

In summary, the first aspect of the present invention provides a semiconductor memory that applies a control pulse signal (ATDX) to the gates of load transistors for biasing bit lines. The control pulse signal has a minimum pulse width to read data out of a selected memory cell. The control pulse signal controls the switching of the load transistors, to shorten a period during which a stress voltage is continuously applied to the drains of unselected memory cells connected to a bit line to which the selected memory cell is connected.

The second aspect of the present invention provides a semiconductor memory that employs a natural transistor whose channel impurity concentration is equal to substrate impurity concentration. The natural transistor reduces a drain voltage to read data without increasing production processes and cost.

The third aspect of the present invention tests a nonvolatile semiconductor memory. This aspect writes test data into memory cells in the semiconductor memory and measures a current passing through the memory cells before and after a temperature acceleration step. The measured currents are compared with each other to determine the quality of the semiconductor memory. This aspect of the present invention tests semiconductor memories through a small number of steps in a short time.

Many different embodiments of the present invention may be constructed without departing from the spirit and scope of the present invention, and it should be understood that the present invention is not limited to the specific embodiments described in this specification, except as defined in the appended claims.

We claim:

1. A semiconductor memory comprising:

a plurality of word lines;

a plurality of bit lines;

a plurality of memory cells each being a MIS transistor formed at each intersection of said word and said bit lines, the threshold voltage of said MIS transistor being externally electrically controllable;

a differential sense amplifier for detecting data stored in a selected memory cell located at an intersection of a selected word line and a selected bit line; and a plurality of load transistors, the gates of said load transistors receiving a control pulse signal for biasing said bit lines, the control pulse signal having a minimum pulse width to read data out of said selected memory cell and controlling the switching of said load transistors, to shorten a period during which a stress voltage is continuously applied to the drains of unselected memory cells connected to said bit line to which said selected memory cell is connected.

2. A semiconductor memory as claimed in claim 1, wherein each of said word lines is connected to the gates of corresponding ones of said memory cells arranged in a first direction, each of said bit lines is connected to the drains of corresponding ones of said memory cells arranged in a second direction, said first direction is perpendicular to said second direction, and said differential sense amplifier provides a signal representing data "1" or "0" according to whether or not said selected memory cell is conductive.

3. A semiconductor memory as claimed in claim 1, wherein the control pulse signal supplied to said load transistors for biasing said bit lines is an ATD pulse signal.

4. A semiconductor memory comprising:

a cell array containing a plurality of word lines, a plurality of bit lines, and a plurality of memory cells formed at intersections of said word line and said bit line, respectively; and a data decision circuit for determining data stored in a selected memory cell to be "1" or "1" according to whether or not said selected memory cell passes a current, wherein said data decision circuit includes:

a load means connected between a first power source and a first node;

a first transistor of a first conduction type having a drain connected to said first node, a source connected to a second power source, and a gate connected to a second node; and a second transistor of said first conduction type having a gate connected to said first node and a source connected to said second node, wherein said second node is electrically connected to said bit lines, and said first transistor being a natural transistor whose channel impurity concentration is equal to a substrate impurity concentration.

5. A semiconductor memory as claimed in claim 4, wherein the drain of said second transistor is connected to said first power source through a third transistor of a second conduction type opposite to said first conduction type, as well as to a data output through an inverter, and said third transistor having a gate connected to said second power source.

6. A semiconductor memory as claimed in claim 5, wherein said first and second transistors are n-channel MIS transistors, and said third transistor is a p-channel MIS transistor.

7. A semiconductor memory as claimed in claim 4, wherein said load means is a fourth transistor of a second conduction type opposite to said first conduction type.

8. A semiconductor memory as claimed in claim 7, wherein said first and second transistors are n-channel MIS transistors, and said fourth transistor is a p-channel MIS transistor.

9. A semiconductor memory as claimed in claim 4, wherein said second node is connected to a bus line.

10. A semiconductor memory comprising:

a cell array containing a plurality of word lines, a plurality of bit lines, and a plurality of memory cells formed at intersections of said word line and said bit line, respectively; and a data decision circuit for determining data stored in a selected memory cell to be "1" or "0" according to whether or not said selected memory cell passes current, wherein said data decision circuit includes:

a load means connected between a first power source and a first node;

a first transistor of a first conduction type having a drain connected to said first node, a source connected to a reference power source, and a gate connected to a second node; and a second transistor of said first conduction type having a gate connected to said first node and a source connected to said second node, wherein the source of said second transistor is connected to a third node through a voltage drop transistor of said first conduction type.

11. A semiconductor memory as claimed in claim 10, wherein the drain of said second transistor is connected to said first power source through a third transistor of a second conduction type opposite to said first conduction type, as well as to a data output through an inverter, and the gate of said third transistor is connected to said reference power source.

12. A semiconductor memory as claimed in claim 11, wherein said first, second, and voltage drop transistors are n-channel MIS transistors, and said third transistor is a p-channel MIS transistor.

13. A semiconductor memory as claimed in claim 10, wherein said load means is a fourth transistor of a second conduction type opposite to said first conduction type.

14. A semiconductor memory as claimed in claim 13, wherein said first, second, and voltage drop transistors are n-channel MIS transistors, and said fourth transistor is a p-channel MIS transistor.

15. A semiconductor memory as claimed in claim 10, wherein said third node is connected to a bus line.

16. A semiconductor memory having an array of nonvolatile memory cells and a function of testing changes in data held in said memory cells according to a temperature acceleration step of leaving said semiconductor memory at a high temperature, wherein said semiconductor memory comprises:

a test mode starting means for starting a test mode of said semiconductor memory in response to a predetermined external signal; and a cell array current measuring means for switching, when said test mode is started by said test mode starting means, a connection between said memory cell array and a ground, to measure a current flowing through said memory cell array.

17. A semiconductor memory as claimed in claim 16, wherein said cell array current measuring means writes predetermined data into said memory cell array, measures a current flowing through said memory cell array, leaves said semiconductor memory at a high temperature to accelerate defects in said memory cells, and again measures a current flowing through said memory cell array.

18. A semiconductor memory as claimed in claim 16, wherein an output of said cell array current measuring means is converted by an analog/digital converter and is temporarily stored in a register.

* * * * *

UNITED STATES PATENT AND TRADEMARK OFFICE
CERTIFICATE OF CORRECTION

PATENT NO. : 5,519,652
DATED : May 21, 1996
INVENTOR(S) : Sinsuke KUMAKURA, et al.

It is certified that error appears in the above-indentified patent and that said Letters Patent is hereby corrected as shown below:

| | |
|---|---|
| Col. 1, | line 25, after "line" insert --,--;<br>line 32, after "cut" insert --off--. |
| Col. 9, | line 63, change "p--" to --p⁻--;<br>line 66, change "p--" to --p⁻--. |
| Col. 10, | line 2, change "p--" to --p⁻--;<br>line 5, change "p--" to --p⁻--;<br>line 6, change "p--" to --p⁻--. |
| Col. 12, | line 66, change "when" to --When--. |
| Col. 13, | line 46, change "ireveal" to --reveal--. |
| Col. 15, | line 67, change "1" (second occurrence) to --0--. |

Signed and Sealed this

Thirteenth Day of August, 1996

Attest:

BRUCE LEHMAN

*Attesting Officer*     *Commissioner of Patents and Trademarks*